United States Patent
Hatano et al.

(10) Patent No.: US 9,985,627 B2
(45) Date of Patent: May 29, 2018

(54) DRIVE CIRCUIT AND MODULE EQUIPPED WITH SAME

(71) Applicant: Rohm Co., Ltd., Kyoto (JP)

(72) Inventors: Hiroyuki Hatano, Kyoto (JP); Akeyuki Komatsu, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days. days.

(21) Appl. No.: 15/198,087

(22) Filed: Jun. 30, 2016

(65) Prior Publication Data
US 2017/0005652 A1    Jan. 5, 2017

(30) Foreign Application Priority Data

Jul. 2, 2015  (JP) ................ 2015-133573

(51) Int. Cl.
| | |
|---|---|
| *H02P 1/00* | (2006.01) |
| *H03B 1/00* | (2006.01) |
| *H03K 17/691* | (2006.01) |
| *H03K 17/16* | (2006.01) |
| *H02M 1/08* | (2006.01) |

(52) U.S. Cl.
CPC ......... *H03K 17/691* (2013.01); *H03K 17/165* (2013.01); *H02M 1/08* (2013.01); *H03K 2217/0036* (2013.01)

(58) Field of Classification Search
None
See application file for complete search history.

(56) References Cited

U.S. PATENT DOCUMENTS

| | | | | |
|---|---|---|---|---|
| 4,423,341 A | * | 12/1983 | Shelly | H02M 1/08 327/112 |
| 2013/0021831 A1 | * | 1/2013 | Kitabatake | H02M 7/5387 363/131 |

FOREIGN PATENT DOCUMENTS

JP    2011-259673    12/2011

* cited by examiner

*Primary Examiner* — Bentsu Ro
*Assistant Examiner* — Zemenay Truneh
(74) *Attorney, Agent, or Firm* — Fish & Richardson P.C.

(57) ABSTRACT

A drive circuit includes a control circuit configured to output a polarity signal for controlling ON/OFF of a driving switch, a pulse transformer, electrically connected to the control circuit, configured to transmit the polarity signal, and a discharge circuit, electrically connected to the pulse transformer and a gate terminal of the driving switch, configured to discharge an electric charge accumulated in the gate terminal based on the polarity signal. When the polarity signal having a first polarity is applied to the gate terminal through the pulse transformer, the driving switch is switched to and maintained in an ON state by accumulating the electric charge in the gate terminal. When the polarity signal having a second polarity different from the first polarity is applied to the discharge circuit through the pulse transformer, the driving switch is switched to an OFF state by discharging the electric charge by the discharge circuit.

15 Claims, 10 Drawing Sheets

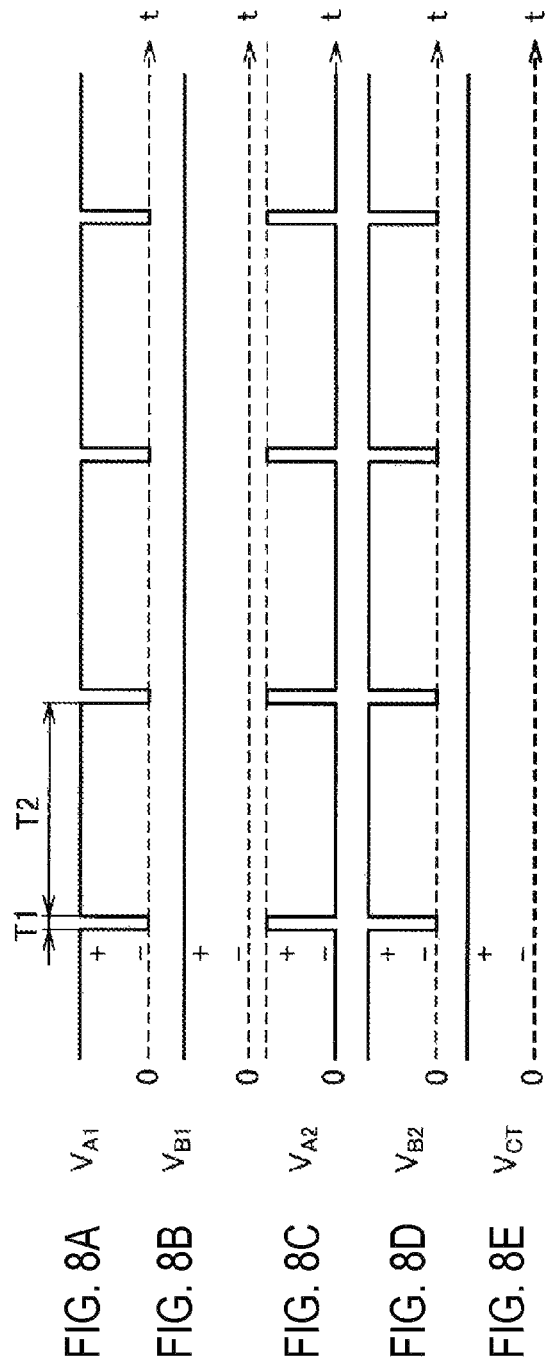

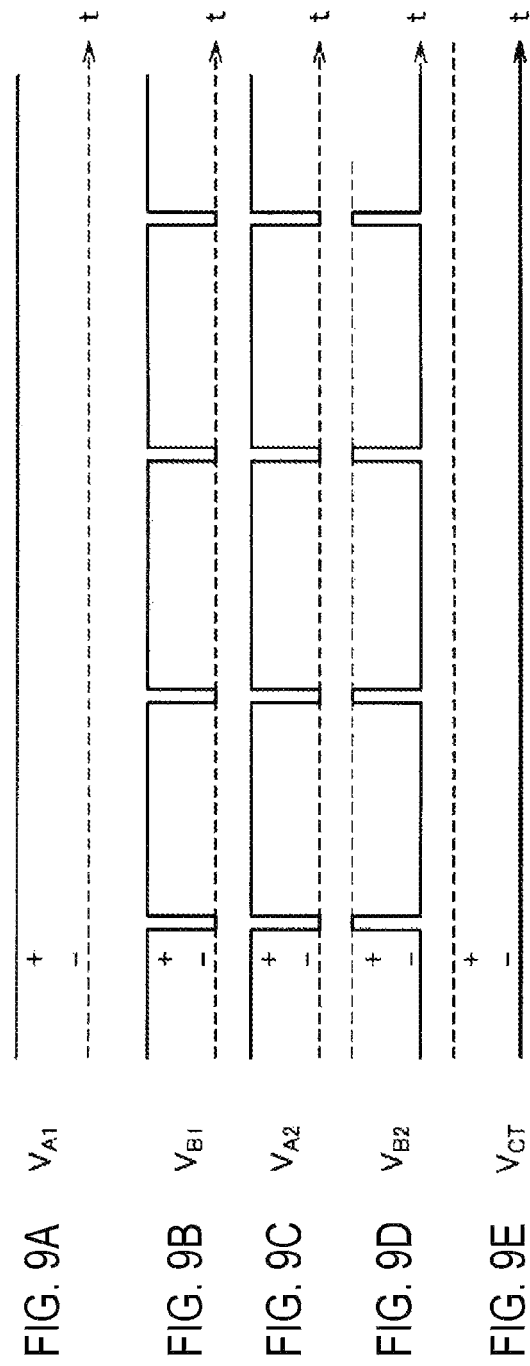

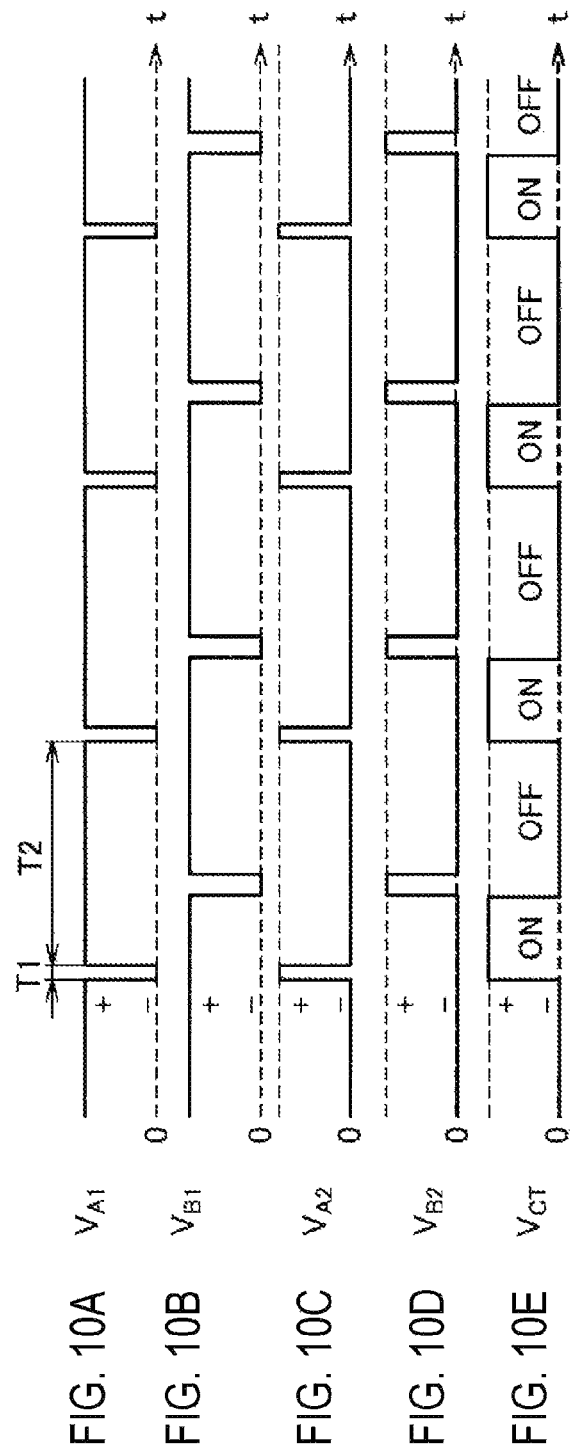

US 9,985,627 B2

DRIVE CIRCUIT AND MODULE EQUIPPED WITH SAME

CROSS-REFERENCE TO RELATED APPLICATION(S)

This application is based upon and claims the benefit of priority from Japanese Patent Application No. 2015-133573, filed on Jul. 2, 2015, the entire contents of which are incorporated herein by reference.

TECHNICAL FIELD

The present disclosure relates to a drive circuit and a module equipped with the drive circuit.

BACKGROUND

In a conventional switching type drive circuit, for example, a signal may be transmitted from a primary side to a control IC of a secondary side through a pulse transformer, and ON/OFF of a driving switch installed in the secondary side may be controlled by the control IC of the secondary side to generate an output voltage.

In such a drive circuit, since the control IC of the secondary side that receives a signal from the primary side through the pulse transformer obtains a driving voltage thereof by being supplied from a power source, an extra power may be consumed when the driving switch is turned on or off.

SUMMARY

The present disclosure provides some embodiments of a drive circuit capable of suppressing an increase in power consumption required for turning on or off a driving switch, and a module equipped with the drive circuit.

According to one embodiment of the present disclosure, there is provided a drive circuit for generating an output voltage for driving a load from a voltage supplied from a first power source through switching operations of a driving switch, including: a control circuit configured to output a polarity signal for controlling ON/OFF of the driving switch; a pulse transformer, electrically connected to the control circuit, configured to transmit the polarity signal output from the control circuit; and a discharge circuit, electrically connected to the pulse transformer and a gate terminal of the driving switch, configured to discharge an electric charge accumulated in the gate terminal of the driving switch based on the polarity signal, wherein, when the polarity signal having a first polarity is applied to the gate terminal through the pulse transformer, the driving switch is switched to an ON state, and is maintained in the ON state by accumulating the electric charge associated with the polarity signal in the gate terminal, and when the polarity signal having a second polarity different from the first polarity is applied to the discharge circuit through the pulse transformer, the driving switch is switched to an OFF state by discharging the electric charge accumulated in the gate terminal by the discharge circuit.

According to another embodiment of the present disclosure, there is provided a motor module including the drive circuit.

According to still another embodiment of the present disclosure, there is provided a power module including the drive circuit.

According to a further embodiment of the present disclosure, there is provided a two-way output power module including the drive circuit.

BRIEF DESCRIPTION OF THE DRAWINGS

FIGS. 8A to 8E are views illustrating operational waveforms when driving switches Q6 and Q7 continuously perform an ON operation in the two-way output power module employing the drive circuit according to the second to fourth embodiments, wherein FIG. 8A is a waveform of an input control voltage $V_{A1}$ at a terminal A1, FIG. 8B is a waveform of an input control voltage $V_{B1}$ at a terminal B1, FIG. 8C is a waveform of a voltage $V_{A2}$ at a terminal A2, FIG. 8D is a waveform of a voltage $V_{B2}$ at a terminal B2, and FIG. 8E is a waveform of a voltage $V_{CT}$ at a common gate terminal CT.

FIGS. 9A to 9E are views illustrating operational waveforms when driving switches Q6 and Q7 continuously perform an OFF operation in the two-way output power module employing the drive circuit according to the second to fourth embodiments, wherein FIG. 9A is a waveform of an input control voltage $V_{A1}$ at the terminal A1, FIG. 9B is a waveform of an input control voltage $V_{B1}$ at the terminal B1, FIG. 9C is a waveform of a voltage $V_{A2}$ at the terminal A2, FIG. 9D is a waveform of a voltage $V_{B2}$ at the terminal B2, and FIG. 9E is a waveform of a voltage $V_{CT}$ at the common gate terminal CT.

FIGS. 10A to 10E are views illustrating operational waveforms when the driving switches Q6 and Q7 perform ON/OFF operations in the two-way output power module employing the drive circuit according to the second to fourth embodiments, wherein FIG. 10A is a waveform of an input control voltage $V_{A1}$ at the terminal A1, FIG. 10B is a waveform of an input control voltage $V_{B1}$ at the terminal B1, FIG. 10C is a waveform of a voltage $V_{A2}$ at the terminal A2, FIG. 10D is a waveform of a voltage $V_{B2}$ at the terminal B2, and FIG. 10E is a waveform of a voltage $V_{CT}$ at the common gate terminal CT.

DETAILED DESCRIPTION

Figure 1:
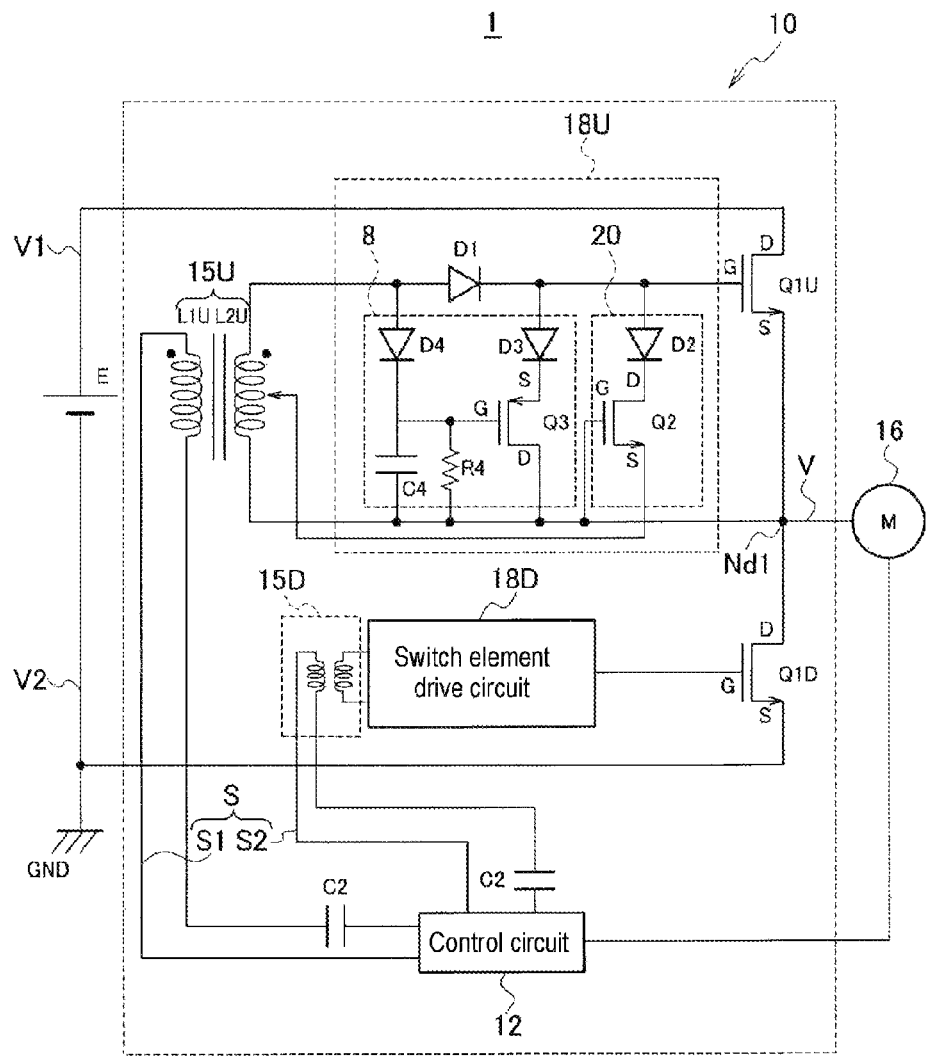
FIG. 1 is a view illustrating a motor module employing a drive circuit according to a first embodiment.

Embodiments of the present disclosure will now be described with reference to the drawings. In the following description of the drawings, like or similar reference numerals are used for like or similar parts. However, it should be noted that the drawings are schematic, and the relationships between thicknesses and planar dimensions of respective components, and the like are different from those of reality. Therefore, specific thicknesses or dimensions should be determined in consideration of the following description. Also, it is understood that parts having different dimensional relationships or ratios are included among the drawings.

Further, the embodiments described below are presented to illustrate apparatuses or methods for embodying the technical concept of the present disclosure and are not intended to limit the materials, features, structures, arrangements, and the like of the components to those shown below. The embodiments may be variously modified within the scope of claims.

First Embodiment

FIG. 1 is a view illustrating a motor module 1 including a DC power source E as a first power source, a drive circuit 10, and a motor unit (M) 16 as a load.

The DC power source E is, for example, a power source for supplying a voltage V1 as a first voltage of 100V from a positive terminal and a voltage V2 as a second voltage from a negative terminal.

The drive circuit 10 includes a driving switch Q1U, a driving switch Q1D, a control circuit 12, a pulse transformer 15U, a pulse transformer 15D, a driving switch drive circuit 18U, and a driving switch drive circuit 18D, and generates and outputs an output voltage V based on the DC power source E.

The driving switch Q1U is, for example, an NMOS transistor, in which a drain terminal D is connected to the positive terminal of the DC power source E and a source terminal S is connected to the motor unit (M) 16.

The driving switch Q1D is, for example, an NMOS transistor, in which a drain terminal D is connected to the source terminal S of the driving switch Q1U and the motor unit (M) 16, and a source terminal S is connected to the negative terminal of the DC power source E.

Here, a connection point between the source terminal S of the driving switch Q1U and the drain terminal D of the driving switch Q1D is referred to as a node Nd1. The motor unit (M) 16 is connected to the source terminal S of the driving switch Q1U and the drain terminal D of the driving switch Q1D at the node Nd1.

When the driving switch Q1U is in an ON state, the driving switch Q1U outputs a voltage V1 to the node Nd1. In this state, the output voltage V is the voltage V1.

When the driving switch Q1D is in an ON state, the driving switch Q1D outputs a voltage V2 to the node Nd1. In this state, the output voltage V is the voltage V2.

The control circuit 12 is connected to the motor unit (M) 16. The control circuit 12 monitors a revolution per minute (RPM) of the motor unit 16, and outputs a polarity signal S for controlling ON/OFF of the driving switch Q1U and the driving switch Q1D based on the RPM. Here, the control circuit 12 outputs as the polarity signal S either a positive polarity signal having a first polarity or a negative polarity signal having a second polarity different from the first polarity. Here, the polarity signal S output by the control circuit 12 to the driving switch drive circuit 18U will be referred to as a polarity signal S1, and the polarity signal S output to the driving switch drive circuit 18D will be referred to as a polarity signal S2.

The pulse transformer 15U has a primary inductor L1U and a secondary inductor L2U. The pulse transformer 15U is electrically connected to the control circuit 12 and transmits the polarity signal S1 output from the control circuit 12.

The primary inductor L1U is a coil configured by a predetermined number of windings, in which one end thereof is connected to the control circuit 12 and the other end thereof is connected to the control circuit 12 through a capacitor C2. The primary inductor L1U transmits the signal output from the control circuit 12 to the secondary inductor L2U.

The secondary inductor L2U is a coil configured by a predetermined number of windings, in which one end thereof is electrically connected to a gate terminal G of the driving switch Q1U and the other end thereof is electrically connected to the source terminal S of the driving switch Q1U.

The driving switch drive circuit 18U is connected to the pulse transformer 15U and the gate terminal G of the driving switch Q1U, and controls ON/OFF of the driving switch Q1U based on the polarity signal S1 output from the control circuit 12 and supplied through the pulse transformer 15U.

The driving switch drive circuit 18D is connected to the pulse transformer 15D and the gate terminal G of the driving switch Q1D, and controls ON/OFF of the driving switch Q1D based on the polarity signal S2 output from the control circuit 12 and supplied through the pulse transformer 15D. Further, the driving switch Q1D is controlled to be turned on and off at a timing different from that of the driving switch Q1U.

The motor module 1 operates based on the output voltage V supplied from the drive circuit 10.

Driving Switch Drive Circuit

A specific configuration of the driving switch drive circuit 18U according to a first embodiment will be described with reference to FIG. 1. Also, this is the same for the driving switch drive circuit 18D.

The driving switch drive circuit 18U includes a diode D1, a discharge circuit 20, and a reset circuit 8. Also, the driving switch drive circuit 18D may include a diode, a discharge circuit, and a reset circuit the same as the driving switch drive circuit 18U. Further, in the driving switch drive circuit 18U, at least the reset circuit 8 may be a preferred example but not an essential component.

An anode terminal of the diode D1 is connected to one end of the secondary inductor L2U, and a cathode terminal thereof is connected to the gate terminal G of the driving switch Q1U. In other words, one end of the secondary inductor L2U is connected to the gate terminal of the driving switch Q1U through the diode D1. Since the diode D1 constitutes the connection between the secondary inductor L2U and the gate terminal G of the driving switch Q1U, an electric charge accumulated in the gate terminal G of the driving switch Q1U can be prevented from being leaked to the secondary inductor L2U.

The discharge circuit 20 includes a diode D2 as a first diode and a discharge transistor Q2. The discharge circuit 20 is connected to the gate terminal G of the driving switch Q1U and the secondary inductor L2U.

An anode terminal of the diode D2 is connected to the gate terminal G of the driving switch Q1U and the cathode terminal of the diode D1. In other words, the discharge circuit 20 is connected to one end of the secondary inductor L2U through the diode D1.

The discharge transistor Q2 is, for example, an NMOS transistor, in which a drain terminal D is connected to a cathode terminal of the diode D2. In other words, the drain terminal D of the discharge transistor Q2 is connected to the gate terminal G of the driving switch Q1U through the diode D2. Further, a gate terminal G of the discharge transistor Q2 is connected to the other end of the secondary inductor L2U. Also, a source terminal S of the discharge transistor Q2 is connected to a middle end between one end and the other end of the secondary inductor L2U.

The reset circuit 8 includes a diode D4, a capacitor C4 as a first capacitor, a resistor R4 as a first resistor, a diode D3, and a reset transistor Q3.

An anode terminal of the diode D4 is connected to the anode terminal of the diode D1 and one end of the secondary inductor L2U.

One end of the capacitor C4 is connected to a cathode terminal of the diode D4, and the other end thereof is connected to the other end of the secondary inductor L2U.

One end of the resistor R4 is connected to a cathode terminal of the diode D4 and one end of the capacitor C4, and the other end thereof is connected to the other end of the secondary inductor L2U.

An anode terminal of the diode D3 is connected to the gate terminal S of the driving switch Q1U and the cathode terminal of the diode D1.

The reset transistor Q3 is, for example, a PMOS transistor, in which a source terminal S is connected to a cathode terminal of the diode D3, a gate terminal G is connected to the cathode terminal of the diode D4, one end of the capacitor C4, and one end of the resistor R4, and a drain terminal D is connected to the other end of the secondary inductor L2U.

Operation of Driving Switch Drive Circuit

In the driving switch drive circuit 18U, when the polarity signal S1 having a positive polarity output from the control circuit 12 is applied to the gate terminal G of the driving switch Q1U through the pulse transformer 15U, since a positive charge is supplied to the gate terminal, the driving switch Q1U is turned on. As the charge based on the polarity signal S1 having a positive polarity is accumulated in the gate terminal G, the ON state of the driving switch Q1U is maintained. Accordingly, the voltage V1 is supplied as the output voltage V to the motor unit 16. At this time, since a signal level of the other end of the secondary inductor L2U is applied to the gate terminal G of the discharge transistor Q2 and a signal level of a middle end higher than the signal level of the other end is applied to the source terminal S thereof, the discharge transistor Q2 is turned off.

Further, when the polarity signal S1 having a negative polarity output from the control circuit 12 is applied to the discharge circuit 20 through the pulse transformer 15U, since the signal level of the other end of the secondary inductor L2U is applied to the gate terminal G of the discharge transistor Q2 and a signal level of the middle end lower than the signal level of the secondary inductor L2U is applied to the source terminal S thereof, the discharge transistor Q2 is turned on, so that the charge accumulated in the gate terminal G of the driving switch Q1U is discharged to turn off the driving switch Q1U.

That is, when the polarity signal S1 having a negative polarity is applied through the pulse transformer 15U, the discharge circuit 20 discharges the charge accumulated in the gate terminal G of the driving switch Q1U.

In this manner, the driving switch drive circuit 18U controls ON/OFF of the driving switch Q1D based on the polarity signal S1 output from the control circuit 12.

Also, the driving switch drive circuit 18D similarly controls ON/OFF of the driving switch Q1U based on the polarity signal S2 output from the control circuit 12.

Further, the drive circuit 10 alternately turns on the driving switch Q1U and the driving switch Q1D by the driving switch drive circuit 18U and the driving switch drive circuit 18D, and alternately supplies the voltages V1 and V2 as the output voltage V to the motor unit 16. Accordingly, the motor unit 16 operates.

Here, in the reset circuit 8 of the driving switch drive circuit 18U, when the polarity signal S1 having a positive polarity is interrupted and when a first predetermined period of time has lapsed, for example, when the charge of the capacitor C4 in a fully charged state is discharged through the resistor R4 and a voltage applied to the gate terminal G of the reset transistor Q3 has a value equal to or lower than a predetermined value, the reset transistor Q3 is turned on to draw out the charge accumulated in the gate terminal of the driving switch Q1U, regardless of whether the discharge circuit 20 is in an ON state. Accordingly, when the driving switch Q1U is not controlled by the control circuit 12, since the driving switch drive circuit 18U surely draws out the charge accumulated in the gate terminal of the driving switch Q1U to turn it off, the driving switch Q1U can be prevented from being turned on by the charge remaining in the gate terminal G unintentionally, the power supplied through the driving switch Q1U can be prevented from being supplied to the load such as the motor unit 16 or the like, and in addition, malfunction of the load can be prevented. Also, this is the same for the driving switch drive circuit 18D.

Further, in the driving switch Q1U, the charge accumulated in the gate terminal G may be discharged to the outside due to leakage with the lapse of time, leading to a possibility that the driving switch Q1U is unintentionally turned off. In this connection, the control circuit 12 may output the polarity signal S1 having a positive polarity at every second predetermined time period shorter than the first predetermined time period when the driving switch Q1U is maintained in an ON state. In this case, the charge accumulated in the driving switch Q1U may be more stably held to let the ON state continue, compared with the case in which the control circuit 12 supplies the polarity signal S1 having a positive polarity to the gate terminal G of the driving switch Q1U through the pulse transformer 15U once. Also, this is the same for the case of the driving switch Q1D.

Operation of Drive Circuit

Figure 2:
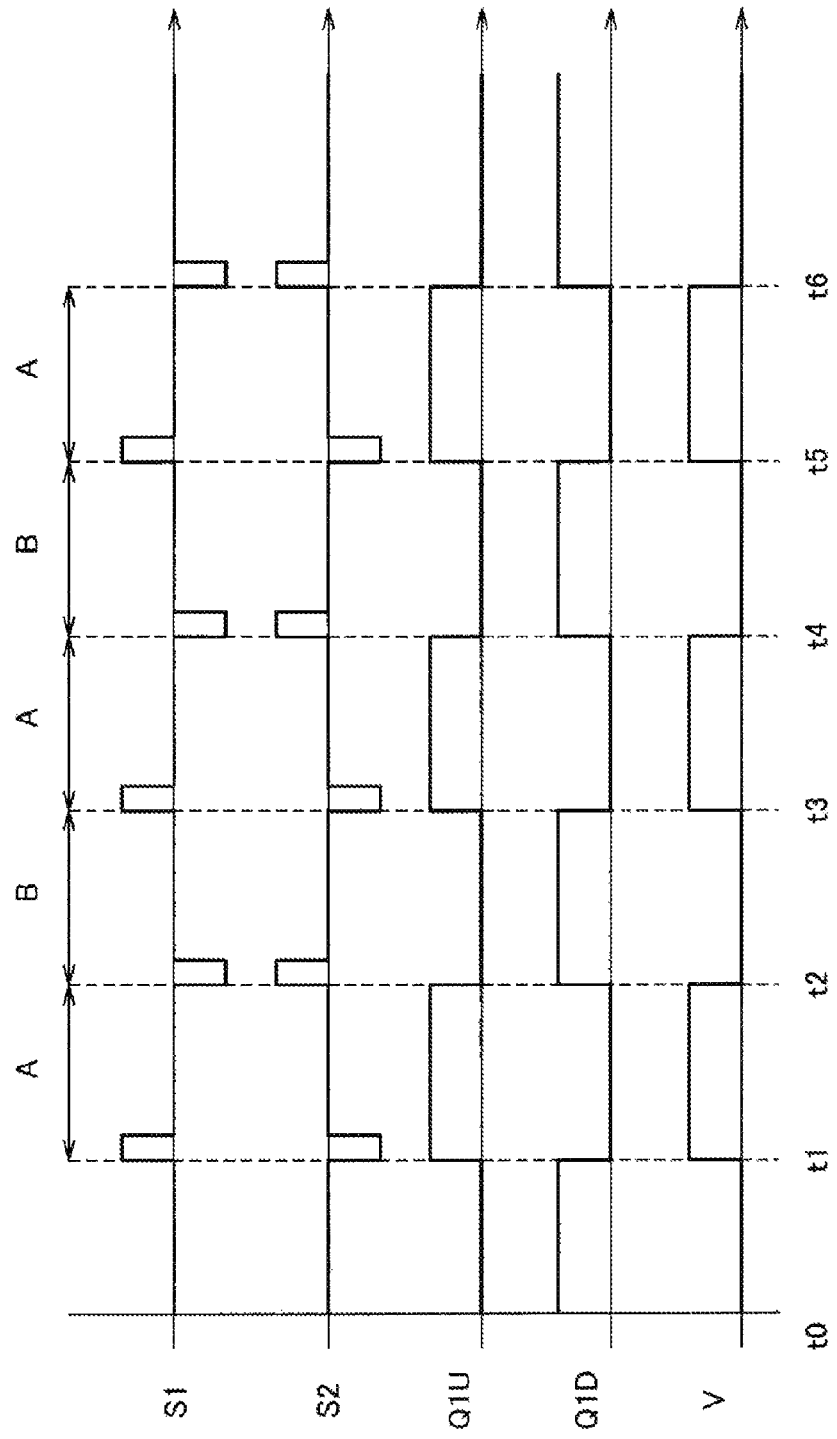
FIG. 2 is a timing chart illustrating signal waveforms for sequential operations of the drive circuit according to the first embodiment.

FIG. 2 is a timing chart illustrating signals waveforms for sequential operations of the drive circuit 10 illustrated in FIG. 1. In the driver circuit 10, the driving switch Q1U is turned on and the driving switch Q1D is turned off during periods A as first predetermined periods of times t1 to t2, t3 to t4, and t5 to t6, and the driving switch Q1U is turned off and the driving switch Q1D is turned on during periods B as first predetermined periods of times t2 to t3 and t4 to t5. Also, times t0 to t6 are common for respective signal waveforms. Also, each of the periods A is, for example, 10 ms, and a pulse width of the polarity signal S1 is, for example, 2 ms. Also, each of the periods B is, for example, 10 ms, and a pulse width of the polarity signal S2 is, for example, 2 ms.

At times t0 to t1, the motor unit 16 is in an operational state, the driving switch Q1U is in an OFF state, and the driving switch Q1D is in an ON state. Thus, the output voltage V is, for example, 0V.

At the time t1, the polarity signal S1 having a positive polarity output from the control circuit 12 is supplied to the driving switch drive circuit 18U to turn on the driving switch Q1U, and the polarity signal S2 having a negative polarity output from the control signal 12 is supplied to the driving switch drive circuit 18D to turn off the driving switch Q1D. Accordingly, the output voltage V of the node Nd1 is increased to increase the RPM of the motor unit 16.

At the time t2, when the control circuit 12 detects that the RPM of the motor unit 16 is equal to or greater than a predetermined number, the polarity signal S1 having a negative polarity output from the control circuit 12 is supplied to the driving switch drive circuit 18U to turn off the driving switch Q1U and the polarity signal S2 having a positive polarity output from the control circuit 12 is supplied to the driving switch drive circuit 18D to turn on the driving switch Q1D. Accordingly, the output voltage V of the node Nd1 is decreased to decrease the RPM of the motor unit 16.

At the time t3, when the control circuit 12 detects that the RPM of the motor unit 16 is smaller than the predetermined number, the polarity signal S1 having a positive polarity output from the control circuit 12 is supplied to the driving switch drive circuit 18U to turn on the driving switch Q1U and the polarity signal S2 having a negative polarity output from the control circuit 12 is supplied to the driving switch drive circuit 18D to turn off the driving switch Q1D. Accordingly, the output voltage V of the node Nd1 is increased to increase the RPM of the motor unit 16 again.

At the times t4 and t6, the same operation as that of the time t2 is performed, and at the time t5, the same operation as that of the time t3 is performed, and thus, a description thereof will be omitted.

As described above, in the drive circuit 10 according to the first embodiment, since the polarity signal S1 having a positive polarity output from the control circuit 12 is supplied to the gate terminal G of the driving switch Q1U through the pulse transformer 15 to accumulate a charge in the corresponding gate terminal G based on the polarity signal S1 having a positive polarity, the ON state of the driving switch Q1U can be maintained and, at the same time, since the polarity signal S1 having a negative polarity output from the control circuit 12 is supplied to the discharge circuit 20 through the pulse transformer 15 to discharge the charge accumulated in the gate terminal G of the driving switch Q1U to turn off the driving switch Q1U, there is no need to constantly apply a voltage to the gate terminal G when the ON state of the driving switch Q1U is maintained. Thus, it is possible to suppress an increase in unnecessary power consumption required for turning on and off the driving switch.

Modifications

Figure 3:
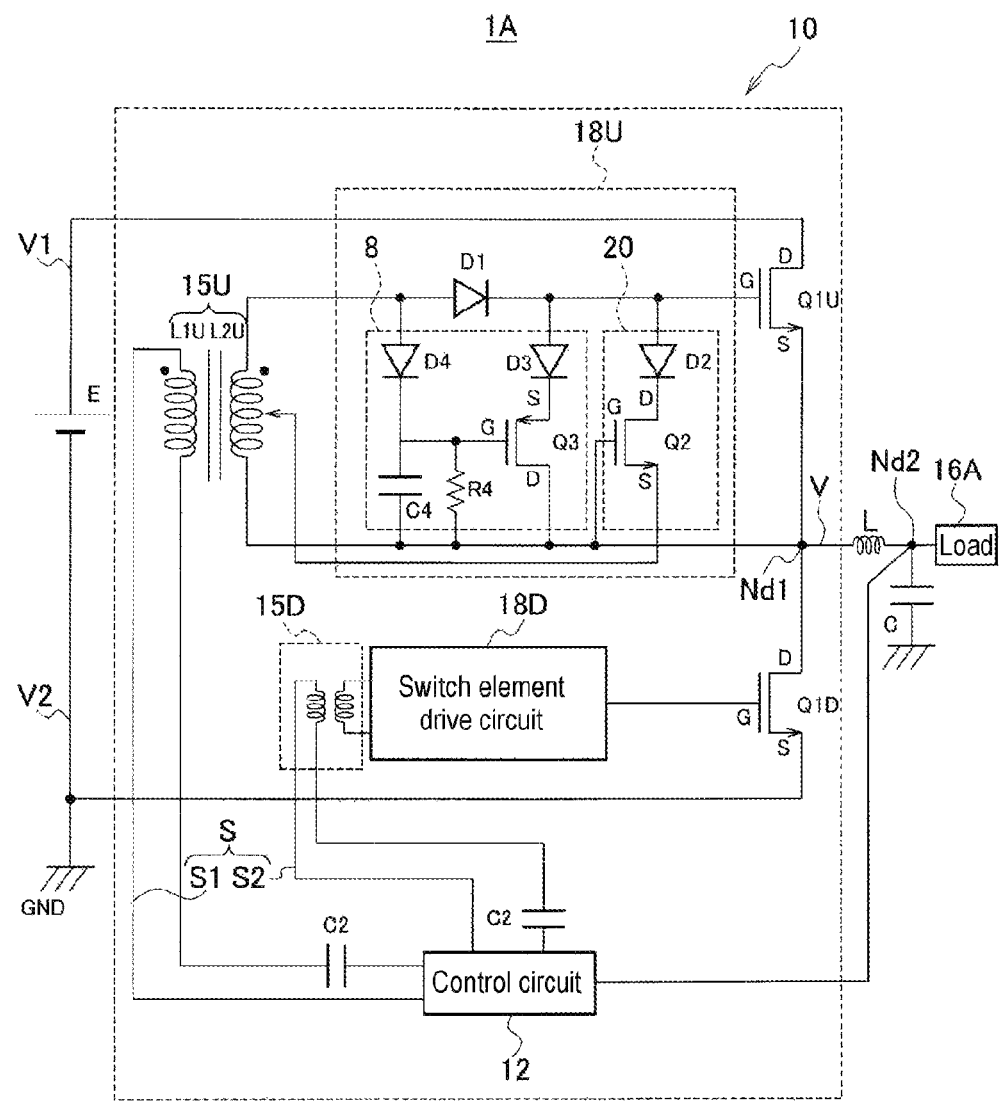
FIG. 3 is a view illustrating a power module according to a modification employing the drive circuit of the first embodiment.

FIG. 3 is a view illustrating a power module 1A including a DC power source E, a drive circuit 10, a coil L, a capacitor C, and a load 16A. Also, the same components as those of the motor module 1 according to the first embodiment illustrated in FIG. 1 are denoted by the same reference numerals and a description thereof will be properly omitted.

The drive circuit 10 includes a driving switch Q1U, a driving switch Q1D, a control circuit 12, a pulse transformer 15U, a pulse transformer 15D, a driving switch drive circuit 18U, and a driving switch drive circuit 18D, and generates an output voltage V based on the DC power source E together with the coil L and the capacitor C and outputs the generated voltage V.

One end of the coil L is connected to a node Nd1 as a connection node between a source terminal S of the driving switch Q1U and a drain terminal D of the driving switch Q1D.

One end of the capacitor C is connected to the other end of the coil L and the other end thereof is connected to a ground potential (or ground) (GND).

The load 16A is connected to one end of the capacitor C, and operates based on the output voltage V supplied from the drive circuit 10.

Here, a voltage generated from the connection point between the other end of the coil L and the one end of the capacitor C is the output voltage V.

The control circuit 12 is connected to the other end of the coil L, one end of the capacitor C, and the load 16A. The control circuit 12 monitors the state of the output voltage V and outputs a polarity signal S for controlling ON/OFF of the driving switch Q1U and the driving switch Q1D based on a level of the output voltage V.

Operation of Driving Switch Drive Circuit

In the driving switch drive circuit 18U, when a polarity signal S1 having a positive polarity output from the control circuit 12 is applied to a gate terminal G of the driving switch Q1U through the pulse transformer 15U, since a positive charge is supplied to the gate terminal, the driving switch Q1U is turned on, and as the charge based on the polarity signal S1 having a positive polarity is accumulated in the gate terminal G, the ON state of the driving switch Q1U is maintained. Accordingly, a voltage V1 is supplied as the output voltage V to the load 16A. At this time, since a signal level of the other end of the secondary inductor L2U is applied to the gate terminal G of the discharge transistor Q2 and a signal level of a middle end higher than the signal level of the other end is supplied to the source terminal S thereof, the discharge transistor Q2 is turned off.

Further, when the polarity signal S1 having a negative polarity output from the control circuit 12 is applied to the discharge circuit 20 through the pulse transformer 15U, since a signal level of the other end of the secondary inductor L2U is applied to the gate terminal G of the discharge transistor Q2 and a signal level of the middle end lower than the signal level of the secondary inductor L2U is applied to the source terminal S thereof, the discharge transistor Q2 is turned on, so that the charge accumulated in the gate terminal G of the driving switch Q1U is discharged to turn off the driving switch Q1U.

That is, when the polarity signal S1 having a negative polarity is applied through the pulse transformer 15U, the discharge circuit 20 discharges the charge accumulated in the gate terminal G of the driving switch Q1U.

In this manner, the driving switch drive circuit 18U controls ON/OFF of the driving switch Q1D based on the polarity signal S1 output from the control circuit 12.

Also, the driving switch drive circuit 18D similarly controls ON/OFF of the driving switch Q1U based on a polarity signal S2 output from the control circuit 12.

Further, the drive circuit 10 alternately turns on the driving switch Q1U and the driving switch Q1D by the driving switch drive circuit 18U and the driving switch drive circuit 18D, and generates the output voltage V, by converting its output into a DC voltage by a low pass filter consisting of a coil L and a capacitor C, and supplies the same to the load 16A.

According to the first embodiment, it is possible to provide the drive circuit capable of suppressing an increase in power consumption required for turning on or off the driving switch.

Further, according to the first embodiment, it is possible to provide the motor module equipped with the drive circuit.

In addition, according to the modification of the first embodiment, it is possible to provide the power module equipped with the drive circuit.

Second Embodiment

Figure 4:
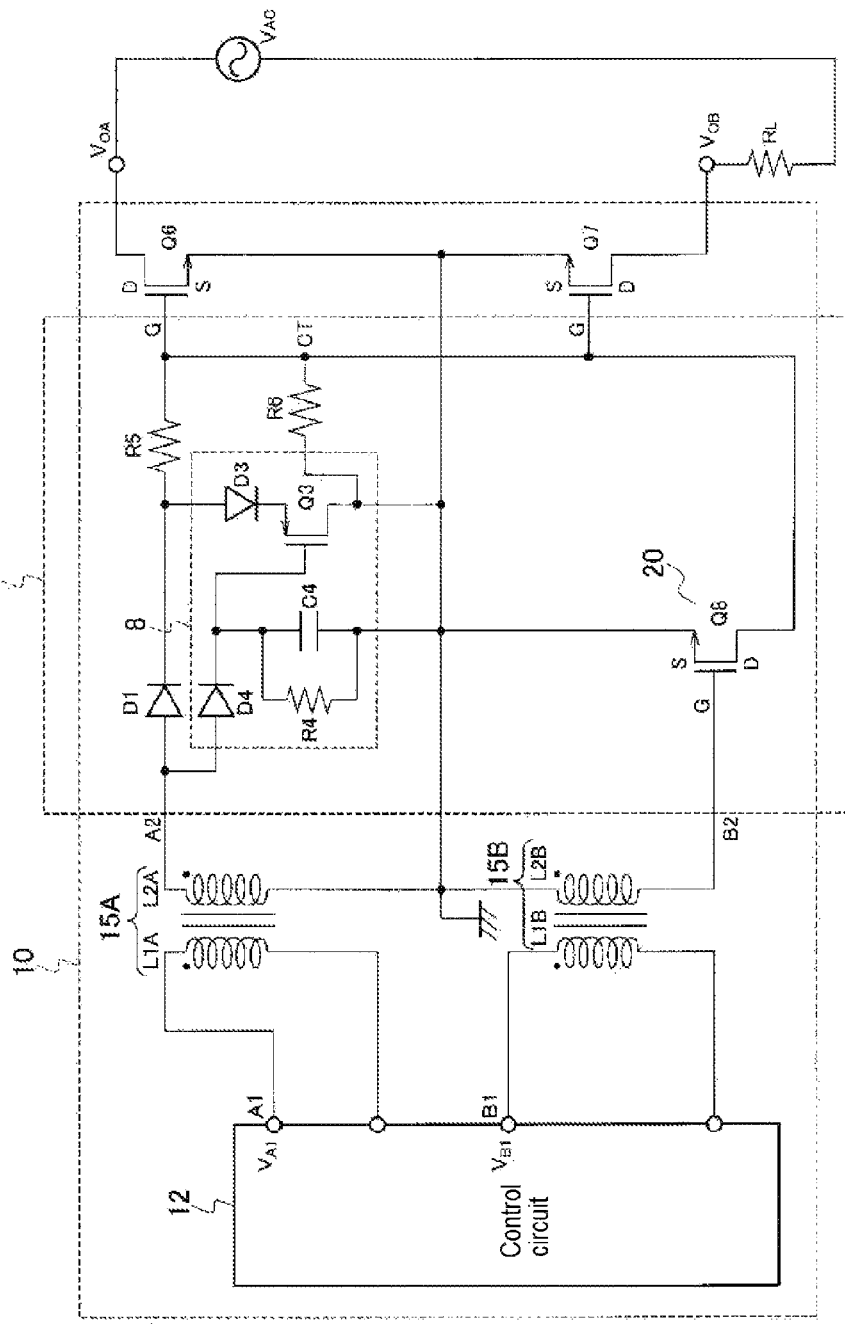
FIG. 4 is a view illustrating a two-way output power module employing a drive circuit according to a second embodiment.

FIG. 4 is a view illustrating a two-way output power module 2 equipped with a drive circuit 10 according to a second embodiment.

FIG. 4 is a view illustrating the two-way output power module 2 including an AC power source $V_{AC}$ as a power source, a drive circuit 10, and a load resistor $R_L$.

The AC power source $V_{AC}$ is, for example, a power source for supplying an AC voltage of 100V to the load resistor $R_L$ connected between an output terminal $V_{OA}$ and an output terminal $V_{OB}$.

The drive circuit 10 includes a driving switch Q6, a driving switch Q7, a control circuit 12, a pulse transformer 15A, a pulse transformer 15B, and a driving switch drive circuit 18, and bi-directionally drives the load resistor $R_L$ based on the AC power source $V_{AC}$.

The driving switch Q6 is, for example, an NMOS transistor, in which a drain terminal D is connected to the output terminal $V_{OA}$ connected to one side of the AC power source $V_{AC}$ and a source terminal S is connected to the ground potential.

The driving switch Q7 is, for example, an NMOS transistor, in which a drain terminal D is connected to the output terminal $V_{OB}$ connected to the other side of the AC power source $V_{AC}$ through the load resistor $R_L$, and a source terminal S is connected to the ground potential.

Here, the source terminal S of the driving switch Q6 and the source terminal S of the driving switch Q7 are commonly connected to the ground potential.

The control circuit 12 is connected to the pulse transformer 15A and the pulse transformer 15B. The control circuit 12 outputs a polarity signal $V_{A1}$ and a polarity signal $V_{B1}$ for controlling ON/OFF of the driving switch Q6 and the driving switch Q7. Here, the control circuit 12 outputs either a positive polarity signal having a first polarity as the polarity signal $V_{A1}$ or a negative polarity signal having a second polarity different from the first polarity. Similarly, the control circuit 12 outputs either a positive polarity signal having a first polarity as the polarity signal $V_{B1}$ or a negative polarity signal having a second polarity different from the first polarity. Here, the polarity signal output by the control circuit 12 to the driving switch drive circuit 18 will be referred to as the polarity signal $V_{A1}$ and the polarity signal $V_{B1}$.

The pulse transformer 15A has a primary inductor L1A and a secondary inductor L2A. The pulse transformer 15A is electrically connected to the control circuit 12 and transmits the polarity signal $V_{A1}$ output from the control circuit 12.

The primary inductor L1A is a coil configured by a predetermined number of windings, in which one end thereof is connected to the control circuit 12 and the other end is also connected to the control circuit 12. The primary inductor L1A transmits the signal $V_{A1}$ output from the control circuit 12 to the secondary inductor L2A.

The secondary inductor L2A is a coil configured by a predetermined number of windings, in which one end thereof is electrically connected to the gate terminal G of the driving switch Q6 and the gate terminal G of the driving switch Q7 and the other end thereof is electrically connected to the ground potential.

The pulse transformer 15B has a primary inductor L1B and a secondary inductor L2B. The pulse transformer 15B is electrically connected to the control circuit 12 and transmits the polarity signal $V_{B1}$ output from the control circuit 12.

The primary inductor L1B is a coil configured by a predetermined number of windings, in which one end thereof is connected to the control circuit 12 and the other end is also connected to the control circuit 12. The primary inductor L1B transmits the signal $V_{B1}$ output from the control circuit 12 to the secondary inductor L2B.

The secondary inductor L2B is a coil configured by a predetermined number of windings, in which one end thereof is electrically connected to a gate terminal G of a discharge transistor Q8 forming the discharge circuit 20 and the other end thereof is electrically connected to the ground potential.

A drain terminal D of the discharge transistor Q8 forming the discharge circuit 20 is electrically connected to the gate terminal G of the driving switch Q6 and the gate terminal G of the driving switch Q7, and a source terminal S of the discharge transistor Q8 is electrically connected to the ground potential.

The driving switch drive circuit 18 is connected to the pulse transformer 15A, the pulse transformer 15B, the gate terminal G of the driving switch Q6, and the gate terminal G of the driving switch Q7, and controls ON/OFF of the driving switches Q6 and Q7 based on the polarity signals $V_{A1}$ and $V_{B1}$ output from the control circuit 12 and supplied through the pulse transformers 15A and 15B.

The discharge transistor Q8 forming the discharge circuit 20 can discharge gate charges accumulated in the gate terminals G of the driving switches Q6 and Q7 to a ground potential level based on the polarity signal $V_{B1}$ output from the control circuit 12 and supplied through the pulse transformer 15B.

The two-way output power module 2 performs an operation of supplying an AC voltage of the AC power source $V_{AC}$ to the load resistor $R_L$ connected between the output terminal $V_{OA}$ and the output terminal $V_{OB}$ based on an ON/OFF signal supplied from the drive circuit 10.

Driving Switch Drive Circuit

A specific configuration of the driving switch drive circuit 18 according to the second embodiment will be described with reference to FIG. 4.

The driving switch drive circuit 18 includes a diode D1, a discharge circuit 20, and a reset circuit 8. Also, in the driving switch drive circuit 18, at least the reset circuit 8 is a preferred example but not an essential component. Further, a resistor R5 and a resistor R6 are current-limiting resistors of the gates of the driving switches Q6 and Q7. In the driving switch drive circuit 18, at least the current-liming resistors R5 and R6 are a preferred example but not essential components.

An anode terminal of the diode D1 is connected to one end of the secondary inductor L2A, and a cathode terminal thereof is connected to the gate terminal G of the driving switch Q6. In other words, one end of the secondary inductor L2A is connected to the gate terminal of the driving switch Q6 through the diode D1. Since the diode D1 constitutes the connection between the secondary inductor L2A and the gate terminal G of the driving switch Q6, the charge accumulated in the gate terminal G of the driving switch Q6 can be prevented from being leaked to the secondary inductor L2A.

The discharge circuit 20 includes the discharge transistor Q8, and is connected to a common gate terminal CT of the driving switches Q6 and Q7 and the secondary inductor L2A.

One end of the secondary inductor L2B of the pulse transformer 15B is connected to the gate terminal G of the discharge transistor Q8, the other end of the secondary inductor L2B is connected to the ground potential, and the source terminal S of the discharge transistor Q8 is connected to the ground potential. In other words, the discharge circuit 20 is connected to the common gate terminal CT of the driving switches Q6 and Q7 and the other end (ground potential) of the secondary inductors L2A and L2B and can discharge the gate charges accumulated in the gate terminals G of the driving switches Q6 and Q7 to the ground potential based on the polarity signal $V_{B1}$ supplied through the pulse transformer 15B.

The reset circuit 8 includes a diode D4, a capacitor C4 as a first capacitor, a resistor R4 as a first resistor, a diode D3, and a reset transistor Q3.

An anode terminal of the diode D4 is connected to the anode terminal of the diode D1 and one end of the secondary inductor L2A.

One end of the capacitor C4 is connected to a cathode terminal of the diode D4, and the other end thereof is connected to the other end of the secondary inductor L2A.

One end of the resistor R4 is connected to the cathode terminal of the diode D4 and one end of the capacitor C4, and the other end thereof is connected to the other end of the secondary inductor L2A.

An anode terminal of the diode D3 is connected to the gate terminal G of the driving switch Q1U and the cathode terminal of the diode D1.

The reset transistor Q3 is, for example, a PMOS transistor, in which a source terminal S is connected to a cathode terminal of the diode D3, a gate terminal G is connected to the cathode terminal of the diode D4, one end of the capacitor C4, and one end of the resistor R4, and a drain terminal D is connected to the other ends (ground potential) of the secondary inductors L2A and L2B.

Operation of Driving Switch Drive Circuit

FIGS. 10A to 10E is a view illustrating operational waveforms when the driving switches Q6 and Q7 perform ON/OFF operations in the two-way output power module 2 employing the drive circuit 10 according to the second embodiment, wherein FIG. 10A illustrates a waveform of an input control voltage $V_{A1}$ at a terminal A1, FIG. 10B illustrates a waveform of an input control voltage $V_{B1}$ at a terminal B1, FIG. 10C illustrates a waveform of a voltage $V_{A2}$ at a terminal A2, FIG. 10D illustrates a waveform of a voltage $V_{B2}$ at a terminal B2, and FIG. 10E illustrates a waveform of a voltage $V_{CT}$ of a common gate terminal CT.

In the driving switch drive circuit 18, when the polarity signal $V_{A1}$ having a negative polarity output from the control circuit 12 at the terminal A1 is applied to a primary side of the pulse transformer 15A and the polarity signal $V_{A2}$ having a positive polarity output at the terminal A2 of one end of the secondary inductor L2A is applied to the gate terminal G of the driving switch Q6, since a positive charge is supplied to the gate terminal G, the driving switch Q6 is turned on, and as the charge based on the polarity signal $V_{A2}$ having a positive polarity is accumulated in the gate terminal G, the ON state of the driving switch Q6 is maintained. At this time, since the polarity signal $V_{B1}$ having a positive polarity output from the control circuit 12 at the terminal B1 is supplied to a primary side of the pulse transformer 15B, the polarity signal $V_{B2}$ having a negative polarity is applied to the terminal B2 of the other end of the secondary inductor L2B, and a signal level in an OFF state is applied to the gate terminal G of the discharge transistor Q8, the discharge transistor Q8 is turned off. Thus, it maintains an ON state where a potential of the common gate terminal CT of the driving switches Q6 and Q7 has a high level.

Further, when the polarity signal $V_{B1}$ having a negative polarity output from the control circuit 12 is applied through the pulse transformer 15B, the polarity signal $V_{B2}$ having a positive polarity is applied to the B2 terminal of the other end of the secondary inductor L2B, and a signal level in an ON state is applied to the gate terminal G of the discharge transistor Q8, the discharge transistor Q8 is turned on to maintain an OFF state where a potential of the common gate terminal CT of the driving switches Q6 and Q7 has a low level.

That is, when the polarity signal $V_{B1}$ having a negative polarity is applied through the pulse transformer 15B, the discharge transistor Q8 forming the discharge circuit 20 discharges the charge accumulated in the common gate terminal CT of the driving switches Q6 and Q7.

In this manner, the driving switch drive circuit 18 controls ON/OFF of the driving switches Q6 and Q7 based on the polarity signals $V_{A1}$ and $V_{B1}$ output from the control circuit 12.

Further, the drive circuit 10 simultaneously turns on and off the driving switch Q6 and the driving switch Q7 by the driving switch drive circuit 18, and bi-directionally drives the load resistor $R_L$ based on the AC power source $V_{AC}$.

Here, in the reset circuit 8 of the driving switch drive circuit 18, when the polarity signal $V_{A1}$ having a positive polarity is interrupted and when a first predetermined time period has lapsed, for example, when the charge of the capacitor C4 in a fully charged state is discharged through the resistor R4 and a voltage applied to the gate terminal G of the reset transistor Q3 has a value equal to or lower than a predetermined value, the reset transistor Q3 is turned on to draw out the charge accumulated in the common gate terminal CT of the driving switches Q6 and Q7, regardless of whether the discharge transistor Q8 forming the discharge circuit 20 is in an ON state. Accordingly, when the driving switches Q6 and Q7 are not controlled by the control circuit 12, since the driving switch drive circuit 18 surely draws out the charge accumulated in the common gate terminal CT of the driving switches Q6 and Q7 to turn them off, the driving switches Q6 and Q7 can be prevented from being turned on by the charge remaining in the common gate terminal CT unintentionally, and in addition, malfunction of the load can be prevented.

Further, in the driving switches Q6 and Q7, the charge accumulated in the common gate terminal CT may be discharged to the outside due to leakage with the lapse of time, leading to a possibility that the driving switches Q6 and Q7 are unintentionally turned off. In this connection, the control circuit 12 may output the polarity signal $V_{A1}$ having a positive polarity at every second predetermined time period shorter than the first predetermined time period when the driving switches Q6 and Q7 are maintained in an ON state. Accordingly, the charges accumulated in the driving switches Q6 and Q7 may be more stably held to let the ON state continue, compared with the case in which the control circuit 12 supplies the polarity signal $V_{A1}$ having a positive polarity to the common gate terminal CT of the driving switches Q6 and Q7 through the pulse transformer 15A once.

Examples of Other Operational Waveforms of Drive Circuit

FIGS. 8A to 8E is a view illustrating operational waveforms when the driving switches Q6 and Q7 continuously perform an ON operation in the two-way output power module 2 employing the drive circuit 10 according to the second embodiment, wherein FIG. 8A is a waveform of an input control voltage $V_{A1}$ at a terminal A1, FIG. 8B is a waveform of an input control voltage $V_{B1}$ at a terminal B1, FIG. 8C is a waveform of a voltage $V_{A2}$ at a terminal A2, FIG. 8D is a waveform of a voltage $V_{B2}$ at a terminal B2, and FIG. 8E is a waveform of a voltage $V_{CT}$ at a common gate terminal CT.

Further, FIGS. 9A to 9E is a view illustrating operational waveforms when the driving switches Q6 and Q7 continuously perform an OFF operation in the two-way output power module 2 employing the drive circuit 10 according to the second embodiment, wherein FIG. 9A is a waveform of an input control voltage $V_{A1}$ at a terminal A1, FIG. 9B is a waveform of an input control voltage $V_{B1}$ at a terminal B1, FIG. 9C is a waveform of a voltage $V_{A2}$ at a terminal A2, FIG. 9D is a waveform of a voltage $V_{B2}$ at a terminal B2, and FIG. 9E is a waveform of a voltage $V_{CT}$ at a common gate terminal CT.

According to the second embodiment, it is possible to provide the drive circuit capable of suppressing an increase in power consumption required for turning on or off the driving switch.

According to the second embodiment, it is possible to provide the two-way output power module equipped with the foregoing drive circuit.

Third Embodiment

Figure 5:
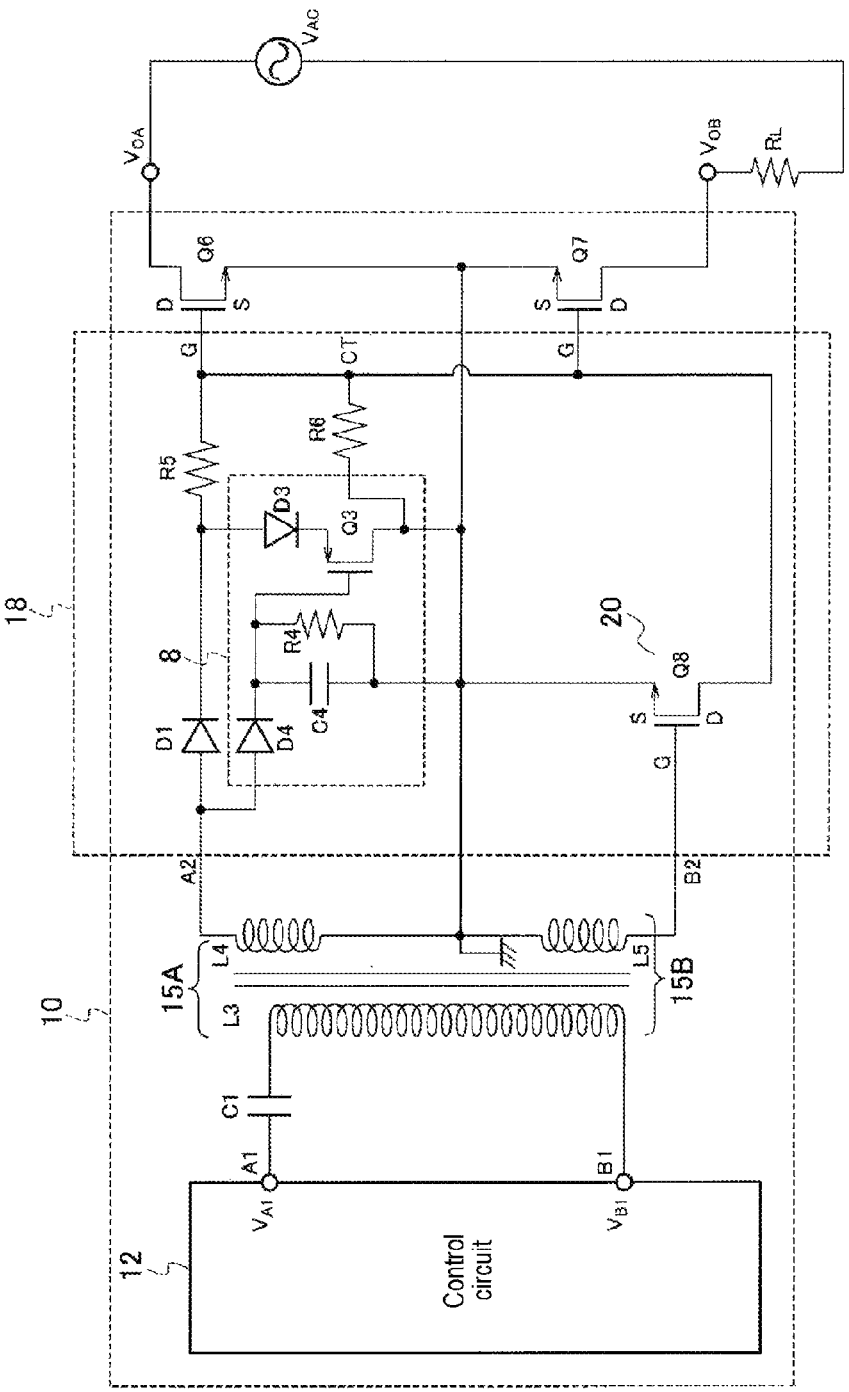
FIG. 5 is a view illustrating a two-way output power module employing a drive circuit according to a third embodiment.

FIG. 5 is a view illustrating a two-way output power module 2 equipped with a drive circuit 10 according to a third embodiment.

FIG. 5 is a view illustrating the two-way output power module 2 including an AC power source $V_{AC}$ as a power source, a drive circuit 10, and a load resistor $R_L$.

The AC power source $V_{AC}$ is, for example, a power source for supplying an AC voltage of 100V to the load resistor $R_L$ connected between an output terminal $V_{OA}$ and an output terminal $V_{OB}$.

The drive circuit 10 includes a driving switch Q6, a driving switch Q7, a control circuit 12, a pulse transformer 15A, a pulse transformer 15B, and a driving switch drive circuit 18, and bi-directionally drives the load resistor $R_L$ based on the AC power source $V_{AC}$.

The driving switch Q6 is, for example, an NMOS transistor, in which a drain terminal D is connected to an output terminal $V_{OA}$ connected to one side of the AC power source $V_{AC}$ and a source terminal S is connected to a ground potential.

The driving switch Q7 is, for example, an NMOS transistor, in which a drain terminal D is connected to an output terminal $V_{OB}$ connected to the other side of the AC power source $V_{AC}$ through the load resistor $R_L$, and a source terminal S is connected to the ground potential.

Here, the source terminal S of the driving switch Q6 and the source terminal S of the driving switch Q7 are commonly connected to the ground potential.

The control circuit 12 is connected to the pulse transformer 15A and the pulse transformer 15B. The control circuit 12 outputs a polarity signal $V_{A1}$ and a polarity signal $V_{B1}$ for controlling ON/OFF of the driving switch Q6 and the driving switch Q7. Here, the control circuit 12 outputs either a positive polarity signal having a first polarity as the polarity signal $V_{A1}$ or a negative polarity signal having a second polarity different from the first polarity. Similarly, the control circuit 12 outputs either a positive polarity signal having a first polarity as the polarity signal $V_{B1}$ or a negative polarity signal having a second polarity different from the first polarity. Here, the polarity signal output by the control circuit 12 to the driving switch drive circuit 18 will be referred to as the polarity signal $V_{A1}$ and the polarity signal $V_{B1}$.

The pulse transformer 15A has a primary inductor L3 and a secondary inductor L4. The pulse transformer 15A is electrically connected to the control circuit 12 through a capacitor C1 and transmits the polarity signal $V_{A1}$ output from the control circuit 12.

The primary inductor L3 is a coil configured by a predetermined number of windings, in which one end thereof is connected to the control circuit 12 through the capacitor C1 and the other end is also connected to the control circuit 12. The primary inductor L3 transmits the signal $V_{A1}$ output from the control circuit 12 to the secondary inductor L4.

The secondary inductor L4 is a coil configured by a predetermined number of windings, in which one end thereof is electrically connected to a gate terminal G of the driving switch Q6 and a gate terminal G of the driving switch Q7 and the other end thereof is electrically connected to the ground potential.

The pulse transformer 15B has the primary inductor L3, which is common with the pulse transformer 15A, and a secondary inductor L5. The pulse transformer 15B is electrically connected to the control circuit 12 through the capacitor C1 and transmits the polarity signal $V_{B1}$ output from the control circuit 12.

The primary inductor L3 is a coil configured by a predetermined number of windings, in which one end thereof is connected to the control circuit 12 through the capacitor C1 and the other end is also connected to the control circuit 12. The primary inductor L3 transmits the signal $V_{B1}$ output from the control circuit 12 to the secondary inductor L5.

The secondary inductor L5 is a coil configured by a predetermined number of windings, in which one end thereof is electrically connected to a gate terminal G of a discharge transistor Q8 forming the discharge circuit 20 and the other end thereof is electrically connected to the ground potential.

A drain terminal D of the discharge transistor Q8 forming the discharge circuit 20 is electrically connected to the gate terminal G of the driving switch Q6 and the gate terminal G of the driving switch Q7, and a source terminal S of the discharge transistor Q8 is electrically connected to the ground potential.

The driving switch drive circuit 18 is connected to the pulse transformer 15A, the pulse transformer 15B, the gate terminal G of the driving switch Q6, and the gate terminal G of the driving switch Q7, and controls ON/OFF of the driving switches Q6 and Q7 based on the polarity signals $V_{A1}$ and $V_{B1}$ output from the control circuit 12 and supplied through the pulse transformers 15A and 15B.

The discharge transistor Q8 forming the discharge circuit 20 can discharge the gate charges accumulated in the gate terminals G of the driving switches Q6 and Q7 to a ground potential level based on the polarity signal $V_{B1}$ output from the control circuit 12 and supplied through the pulse transformer 15B.

The two-way output power module 2 performs an operation of supplying an AC voltage of the AC power source $V_{AC}$ to the load resistor $R_L$ connected between the output terminal $V_{OA}$ and the output terminal $V_{OB}$ based on an ON/OFF signal supplied from the drive circuit 10.

Driving Switch Drive Circuit

A specific configuration of the driving switch drive circuit 18 according to the third embodiment will be described with reference to FIG. 5.

The driving switch drive circuit 18 includes a diode D1, a discharge circuit 20, and a reset circuit 8. Also, in the driving switch drive circuit 18, at least the reset circuit 8 is a preferred example but not an essential component. Further, a resistor R5 and a resistor R6 are current-limiting resistors of the gates of the driving switches Q6 and Q7. In the driving switch drive circuit 18, at least the current-liming resistors R5 and R6 are a preferred example but not essential components.

An anode terminal of the diode D1 is connected to one end of the secondary inductor L4, and a cathode terminal thereof is connected to the gate terminal G of the driving switch Q6. In other words, one end of the secondary inductor L4 is connected to the gate terminal of the driving switch Q6 through the diode D1. Since the diode D1 constitutes the connection between the secondary inductor L4 and the gate terminal G of the driving switch Q6, the charge accumulated in the gate terminal G of the driving switch Q6 can be prevented from being leaked to the secondary inductor L4.

The discharge circuit 20 includes the discharge transistor Q8, and is connected to the common gate terminal CT of the driving switches Q6 and Q7 and the secondary inductor L4.

One end of the secondary inductor L5 of the pulse transformer 15B is connected to the gate terminal G of the discharge transistor Q8, the other end of the secondary inductor L5 is connected to the ground potential, and the source terminal S of the discharge transistor Q8 is connected to the ground potential. In other words, the discharge circuit 20 is connected to the common gate terminal CT of the driving switches Q6 and Q7 and the other end (ground potential) of the secondary inductors L4 and L5 and can discharge the gate charges accumulated in the gate terminals G of the driving switches Q6 and Q7 to the ground potential based on the polarity signal $V_{B1}$ supplied through the pulse transformer 15B.

The reset circuit 8 includes a diode D4, a capacitor C4 as a first capacitor, a resistor R4 as a first resistor, a diode D3, and a reset transistor Q3.

An anode terminal of the diode D4 is connected to the anode terminal of the diode D1 and one end of the secondary inductor L4.

One end of the capacitor C4 is connected to a cathode terminal of the diode D4, and the other end thereof is connected to the other end of the secondary inductor L4.

One end of the resistor R4 is connected to the cathode terminal of the diode D4 and one end of the capacitor C4, and the other end thereof is connected to the other end of the secondary inductor L4.

An anode terminal of the diode D3 is connected to the gate terminal G of the driving switch Q6 and the cathode terminal of the diode D1.

The reset transistor Q3 is, for example, a PMOS transistor, in which a source terminal S is connected to a cathode terminal of the diode D3, a gate terminal G is connected to the cathode terminal of the diode D4, one end of the capacitor C4, and one end of the resistor R4, and a drain terminal D is connected to the other ends (ground potential) of the secondary inductors L4 and L5.

Operation of Driving Switch Drive Circuit

FIGS. 10A to 10E is a view illustrating operational waveforms when the driving switches Q6 and Q7 perform ON/OFF operations in the two-way output power module 2 employing the drive circuit 10 according to the third embodiment, wherein FIG. 10A illustrates a waveform of an input control voltage $V_{A1}$ at a terminal A1, FIG. 10B illustrates a waveform of an input control voltage $V_{B1}$ at a terminal B1, FIG. 10C illustrates a waveform of a voltage $V_{A2}$ at a terminal A2, FIG. 10D illustrates a waveform of a voltage $V_{B2}$ at a terminal B2, and FIG. 10E illustrates a waveform of a voltage $V_{CT}$ of a common gate terminal CT.

In the driving switch drive circuit 18, when the polarity signal $V_{A1}$ having a negative polarity output from the control circuit 12 at the terminal A1 is supplied to a primary side of the pulse transformer 15A and the polarity signal $V_{A2}$ having a positive polarity output to the terminal A2 of one end of the secondary inductor L4 is applied to the gate terminal G of the driving switch Q6, since a positive charge is supplied to the gate terminal G, the driving switch Q6 is turned on, and as the charge based on the polarity signal $V_{A2}$ having a positive polarity is accumulated in the gate terminal G, the ON state of the driving switch Q6 is maintained. At this time, since the polarity signal $V_{B1}$ having a positive polarity output from the control circuit 12 at the terminal B1 is supplied to a primary side of the pulse transformer 15B, the polarity signal $V_{B2}$ having a negative polarity is applied to the terminal B2 of the other end of the secondary inductor L5, and a signal level in an OFF state is supplied to the gate terminal G of the discharge transistor Q8, the discharge transistor Q8 is turned off. Thus, it maintains an ON state where a potential of the common gate terminal CT of the driving switches Q6 and Q7 has a high level.

Further, when the polarity signal $V_{B1}$ having a negative polarity output from the control circuit 12 is applied through the pulse transformer 15B, the polarity signal $V_{B2}$ having a positive polarity is applied to the terminal B2 of the other end of the secondary inductor L5, and a signal level in an ON state is applied to the gate terminal G of the discharge transistor Q8, the discharge transistor Q8 is turned on to maintain an OFF state where a potential of the common gate terminal CT of the driving switches Q6 and Q7 has a low level.

That is, when the polarity signal $V_{B1}$ having a negative polarity is applied through the pulse transformer 15B, the discharge transistor Q8 forming the discharge circuit 20 discharges the charge accumulated in the common gate terminal CT of the driving switches Q6 and Q7.

In this manner, the driving switch drive circuit 18 controls ON/OFF of the driving switches Q6 and Q7 based on the polarity signals $V_{A1}$ and $V_{B1}$ output from the control circuit 12.

Further, the drive circuit 10 simultaneously turns on and off the driving switch Q6 and the driving switch Q7 by the driving switch drive circuit 18, and bi-directionally drives the load resistor $R_L$ based on the AC power source $V_{AC}$.

Here, in the reset circuit 8 of the driving switch drive circuit 18, when the polarity signal $V_{A1}$ having a positive polarity is interrupted and when a first predetermined time period has lapsed, for example, when the charge of the capacitor C4 in a fully charged state is discharged through the resistor R4 and a voltage applied to the gate terminal G of the reset transistor Q3 has a value equal to or lower than a predetermined value, the reset transistor Q3 is turned on to draw out the charge accumulated in the common gate terminal CT of the driving switches Q6 and Q7, regardless of whether the discharge transistor Q8 forming the discharge circuit 20 is in an ON state. Accordingly, when the driving switches Q6 and Q7 are not controlled by the control circuit 12, since the driving switch drive circuit 18 surely draws out the charge accumulated in the common gate terminal CT of the driving switches Q6 and Q7, the driving switches Q6 and Q7 can be prevented from being turned on by the charge remaining in the common gate terminal CT unintentionally, and in addition, malfunction of the load can be prevented.

Further, in the driving switches Q6 and Q7, the charge accumulated in the common gate terminal CT may be discharged to the outside due to leakage with the lapse of time, leading to a possibility that the driving switches Q6 and Q7 are unintentionally turned off. In this connection, the control circuit 12 may output the polarity signal $V_{A1}$ having a positive polarity at every second predetermined time period shorter than the first predetermined time period when the driving switches Q6 and Q7 are maintained in an ON state. Accordingly, the charges accumulated in the driving switches Q6 and Q7 may be more stably held to let the ON state continue, compared with the case in which the control circuit 12 supplies the polarity signal $V_{A1}$ having a positive polarity to the common gate terminal CT of the driving switches Q6 and Q7 through the pulse transformer 15A once.

Examples of Other Operational Waveforms of Drive Circuit

FIGS. 8A to 8E is a view illustrating operational waveforms when the driving switches Q6 and Q7 continuously perform an ON operation in the two-way output power module 2 employing the drive circuit 10 according to the third embodiment, wherein FIG. 8A is a waveform of an input control voltage $V_{A1}$ at a terminal A1, FIG. 8B is a waveform of an input control voltage $V_{B1}$ at a terminal B1, FIG. 8C is a waveform of a voltage $V_{A2}$ at a terminal A2, FIG. 8D is a waveform of a voltage $V_{B2}$ at a terminal B2, and FIG. 8E is a waveform of a voltage $V_{CT}$ at a common gate terminal CT.

Further, FIGS. 9A to 9E is a view illustrating operational waveforms when the driving switches Q6 and Q7 continuously perform an OFF operation in the two-way output power module employing the drive circuit according to the third embodiment, wherein FIG. 9A is a waveform of an input control voltage $V_{A1}$ at a terminal A1, FIG. 9B is a waveform of an input control voltage $V_{B1}$ at a terminal B1, FIG. 9C is a waveform of a voltage $V_{A2}$ at a terminal A2, FIG. 9D is a waveform of a voltage $V_{B2}$ at a terminal B2, and FIG. 9E is a waveform of a voltage $V_{CT}$ at a common gate terminal CT.

According to the third embodiment, it is possible to provide the drive circuit capable of suppressing an increase in power consumption required for turning on or off the driving switch.

According to the third embodiment, it is possible to provide the two-way output power module equipped with the foregoing drive circuit.

Fourth Embodiment

Figure 6:
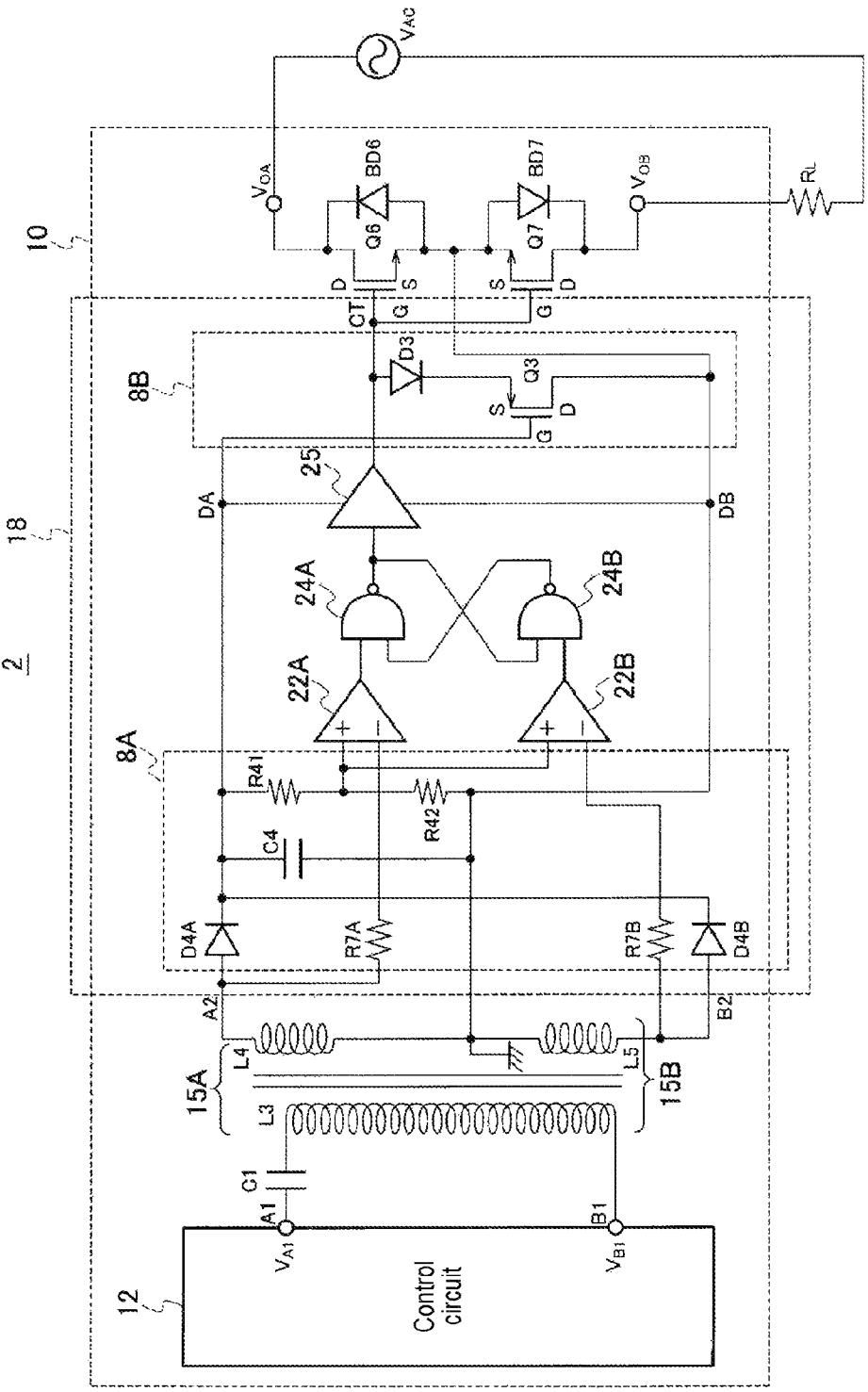
FIG. 6 is a view illustrating two-way output power module employing a drive circuit according to a fourth embodiment.

FIG. 6 is a view illustrating a two-way output power module 2 equipped with a drive circuit 10 according to a fourth embodiment.

FIG. 6 is a view illustrating the two-way output power module 2 including an AC power source $V_{AC}$ as a power source, a drive circuit 10, and a load resistor $R_L$.

The AC power source $V_{AC}$ is, for example, a power source for supplying an AC voltage of 100V to the load resistor $R_L$ connected between an output terminal $V_{OA}$ and an output terminal $V_{OB}$.

The drive circuit 10 includes a driving switch Q6, a driving switch Q7, a control circuit 12, a pulse transformer 15A, a pulse transformer 15B, and a driving switch drive circuit 18, and bi-directionally drives the load resistor $R_L$ based on the AC power source $V_{AC}$.

The driving switch Q6 is, for example, an NMOS transistor, in which a drain terminal D is connected to the output terminal $V_{OA}$ connected to one side of the AC power source $V_{AC}$ and a source terminal S is connected to a ground potential. Further, a parasitically formed body diode BD6 is connected in an inverse-parallel manner between the drain terminal D and the source terminal S of the NMOS transistor forming the driving switch Q6.

The driving switch Q7 is, for example, an NMOS transistor, in which a drain terminal D is connected to the output terminal $V_{OB}$ connected to the other side of the AC power source $V_{AC}$ through the load resistor $R_L$, and a source terminal S is connected to a ground potential. Further, a parasitically formed body diode BD7 is connected in an inverse-parallel manner between the drain terminal D and the source terminal S of the NMOS transistor forming the driving switch Q7.

Here, the source terminal S of the driving switch Q6 and the source terminal S of the driving switch Q7 are commonly connected to the ground potential, and an anode terminal of the body diode BD6 and an anode terminal of the body diode BD7 are also commonly connected to the ground potential.

The control circuit 12 is connected to the pulse transformer 15A and the pulse transformer 15B. Here, the primary inductor L3 of the pulse transformer 15A and the pulse transformer 15B is commonly formed.

The control circuit 12 outputs a polarity signal $V_{A1}$ and a polarity signal $V_{B1}$ for controlling ON/OFF of the driving switch Q6 and the driving switch Q7. Here, the control circuit 12 outputs either a positive polarity signal having a first polarity as the polarity signal $V_{A1}$ or a negative polarity signal having a second polarity different from the first polarity. Similarly, the control circuit 12 outputs either a positive polarity signal having a first polarity as the polarity signal $V_{B1}$ or a negative polarity signal having a second polarity different from the first polarity. Here, the polarity signal output by the control circuit 12 to the driving switch drive circuit 18 will be referred to as the polarity signal $V_{A1}$ and the polarity signal $V_{B1}$.

The pulse transformer 15A has a primary inductor L3 and a secondary inductor L4. The pulse transformer 15A is electrically connected to the control circuit 12 through a capacitor C1 and transmits the polarity signal $V_{A1}$ output from the control circuit 12.

The primary inductor L3 is a coil configured by a predetermined number of windings, in which one end thereof is connected to the control circuit 12 through the capacitor C1 at a terminal A1 and the other end is also connected to the control circuit 12 at a terminal B1. The primary inductor L3 transmits the signal $V_{A1}$ output from the control circuit 12 to the secondary inductor L4.

The secondary inductor L4 is a coil configured by a predetermined number of windings, in which one end thereof is electrically connected to a gate terminal G of the driving switch Q6 through a reset drive ON/OFF circuit 25 and a gate terminal G of the driving switch Q7 and the other end thereof is electrically connected to the ground potential.

The pulse transformer 15B has the primary inductor L3, which is common with the pulse transformer 15A, and a secondary inductor L5. The pulse transformer 15B is electrically connected to the control circuit 12 through the capacitor C1 and transmits the polarity signal $V_{B1}$ output from the control circuit 12. The primary inductor L3 transmits the signal $V_{B1}$ output from the control circuit 12 to the secondary inductor L5.

The secondary inductor L5 is a coil configured by a predetermined number of windings, in which one end thereof is electrically connected to the gate terminal G of the driving switch Q6 and the gate terminal G of the driving switch Q7 through the reset drive ON/OFF circuit 25, and the other end thereof is electrically connected to the ground potential.

The driving switch drive circuit 18 is connected to the pulse transformer 15A, the pulse transformer 15B, the gate terminal G of the driving switch Q6, and the gate terminal G of the driving switch Q7, and controls ON/OFF of the driving switches Q6 and Q7 based on the polarity signals $V_{A1}$ and $V_{B1}$ output from the control circuit 12 and supplied through the pulse transformers 15A and 15B.

The two-way output power module 2 performs an operation of supplying an AC voltage of the AC power source $V_{AC}$ to the load resistor $R_L$ connected between the output terminal $V_{OA}$ and the output terminal $V_{OB}$ based on an ON/OFF signal supplied from the drive circuit 10.

Driving Switch Drive Circuit

A specific configuration of the driving switch drive circuit 18 according to the fourth embodiment will be described with reference to FIG. 6.

The driving switch drive circuit 18 has the reset drive ON/OFF circuit 25 and a flip-flop, and includes NAND gates 24A and 24B for defining an input level of the reset drive ON/OFF circuit 25, comparators 22A and 22B for driving the NAND gates 24A and 24B, and a reset circuit 8(8A and 8B). Also, in the driving switch drive circuit 18, at least the reset circuit 8(8A and 8B) is a preferred example but not an essential component.

One end of the secondary inductor L4 of the pulse transformer 15A is connected to an anode terminal of a diode D4A, and the other end of the secondary inductor L4 is connected to the ground potential. A cathode terminal of the diode D4A is connected to one end of a capacitor C4 and the other end of the capacitor C4 is connected to the ground potential. Further, the cathode terminal of the diode D4A is connected to positive input terminals of the comparators 22A and 22B through a resistor R41. Also, one end of the secondary inductor L4 of the pulse transformer 15A is connected to a negative input terminal of the comparator 22A through a resistor R7A.

One end of the secondary inductor L5 of the pulse transformer 15B is connected to an anode terminal of a diode D4B, and the other end of the secondary inductor L5 is connected to the ground potential. A cathode terminal of the diode D4B is connected to one end of the capacitor C4 and the other end of the capacitor C4 is connected to the ground potential. Further, the cathode terminal of the diode D4B is connected to positive input terminals of the comparators 22A and 22B through the resistor R41. Also, one end of the secondary inductor L5 of the pulse transformer 15B is connected to a negative input terminal of the comparator 22B through a resistor R7B.

An output from the comparator 22A is input to the NAND gate 24A and an output from the comparator 22B is input to the NAND gate 24B.

Figure 7:
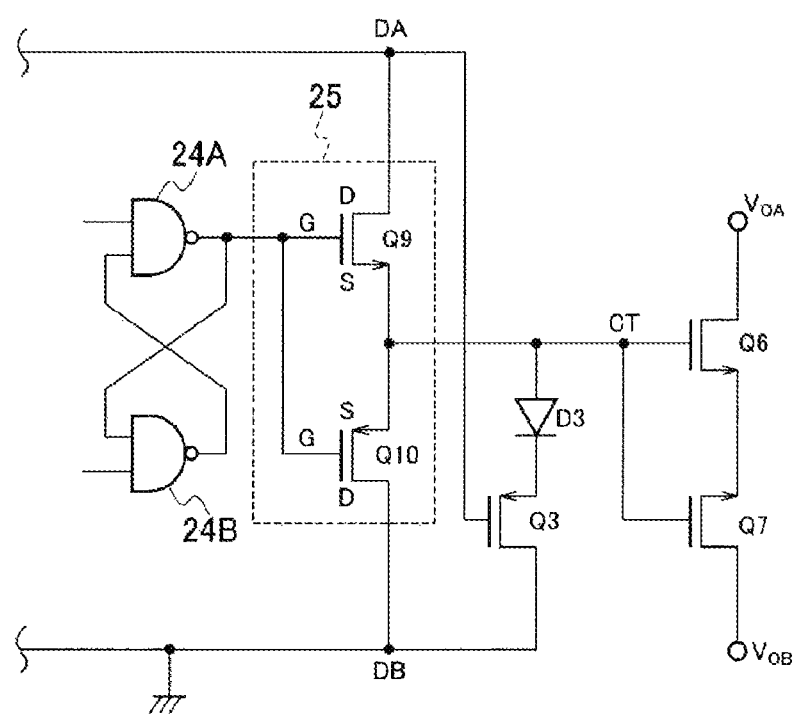
FIG. 7 is a circuit diagram illustrating a specific configuration of a reset drive ON/OFF circuit 25 illustrated in FIG. 6.

Further, FIG. 7 is a circuit diagram illustrating a specific configuration example of the reset drive ON/OFF circuit 25 illustrated in FIG. 6.

As illustrated in FIG. 7, the reset drive ON/OFF circuit 25 may be configured as a CMOS circuit including an NMOS transistor Q9 and a PMOS transistor Q10 as one example. Here, a gate terminal G of the NMOS transistor Q9 and a gate terminal G of the PMOS transistor Q10 are commonly connected and connected to an output of the NAND gate 24A. That is, the reset drive ON/OFF circuit 25 is controlled to be turned on and off by the NAND gates 24A and 24B forming the flip-flop. Also, a drain terminal D of the NMOS transistor Q9 is connected to a terminal DA, and a drain terminal D of the PMOS transistor Q10 is connected to a terminal DB. The terminal DA is connected to the cathode terminal of the diode D4A and the cathode terminal of the diode D4B, and the terminal DB is connected to the other ends (ground potential) of the secondary inductor L4 and the secondary inductor L5.

ON/OFF operations of the driving switches Q6 and Q7 may be performed according to ON/OFF operations of the reset drive ON/OFF circuit 25. For example, when the reset drive ON/OFF circuit 25 is turned on by the NAND gates 24A and 24B forming the flip-flop, that is, when the NMOS transistor Q9 is turned on and the PMOS transistor Q10 is turned off, both the driving switches Q6 and Q7 are turned on. The ON state of the driving switches Q6 and Q7 is maintained by the charge accumulated in the common gate terminal CT of the driving switches Q6 and Q7. When the reset drive ON/OFF circuit 25 is turned off by the NAND gates 24A and 24B forming the flip-flop, that is, when the NMOS transistor Q9 is turned off and the PMOS transistor Q10 is turned on, the charge accumulated in the common gate terminal CT of the driving switches Q7 and Q8 makes the PMOS transistor Q10 conducted and discharged, and both the driving switches Q6 and Q7 are turned off. That is, the reset drive ON/OFF circuit 25 has a function as a discharge circuit for discharging the charge accumulated in the common gate terminal CT of the driving switches Q6 and Q7, together with the function of controlling driving of the driving switches Q6 and Q7.

The reset circuit 8 (8A or 8B) includes a reset circuit 8A having the diodes D4A and D4B, the capacitor C4, the resistors R41 and R42, and resistors the R7A and R7B, and a reset circuit 8B having a diode D3 and a reset transistor Q3.

Anode terminals of the diode D4A and the diode D4B are connected to one ends of the secondary inductor L4 and the secondary inductor L5, respectively, and cathodes terminals thereof are connected to a gate terminal of the reset transistor Q3. In other words, one ends of the secondary inductor L4 and the secondary inductor L5 are connected to the gate terminal of the reset transistor Q3 through the diode D4A and the diode D4B, respectively. Since the diode D4A and the diode D4B constitute the connection between the secondary inductor L4, the secondary inductor L5, and the gate terminal of the reset transistor Q3, the charge accumulated in the gate terminal of the reset transistor Q3 can be prevented from being leaked to the secondary inductor L4 and the secondary inductor L5.

One end of the capacitor C4 is connected to the cathode terminal of the diode D4A, and the other end thereof is connected to the other end (ground potential) of the secondary inductor L4.

One end of the resistor R4 is connected to the cathode terminal of the diode D4A and one end of the capacitor C4, and the other end thereof is connected to the other end (ground potential) of the secondary inductor L4 through the resistor R42.

An anode terminal of the diode D3 is connected to the common gate terminal CT of the driving switches Q6 and Q7 and the output of the reset drive ON/OFF circuit 25.

The reset transistor Q3 is, for example, a PMOS transistor, in which a source terminal S is connected to a cathode terminal of the diode D3, a gate terminal G is connected to the cathode terminals of the diodes D4A and D4B, one end of the capacitor C4, and one end of the resistor R4, and a drain terminal D is connected to the other ends (ground potential) of the secondary inductors L4 and L5.

Operation of Driving Switch Drive Circuit

FIGS. 10A to 10E is a view illustrating operational waveforms when the driving switches Q6 and Q7 perform ON/OFF operations in the two-way output power module 2 employing the drive circuit 10 according to the fourth embodiment, wherein FIG. 10A illustrates a waveform of an input control voltage $V_{A1}$ at a terminal A1, FIG. 10B illustrates a waveform of an input control voltage $V_{B1}$ at a terminal B1, FIG. 10C illustrates a waveform of a voltage $V_{A2}$ at a terminal A2, FIG. 10D illustrates a waveform of a voltage $V_{B2}$ at a terminal B2, and FIG. 10E illustrates a waveform of a voltage $V_{CT}$ of a common gate terminal CT.

In the driving switch drive circuit 18, when the polarity signal $V_{A1}$ having a negative polarity output from the control circuit 12 at the terminal A1 is applied to a primary side of the pulse transformer 15A and the polarity signal $V_{A2}$ having a positive polarity output at the terminal A2 of one end of the secondary inductor L4 is applied to the common gate terminal CT of the driving switches Q6 and Q7 through the NMOS transistor Q9 of the reset drive ON/OFF circuit 25, since a positive charge is supplied to the common gate terminal CT, both the driving switches Q6 and Q7 are turned on, and as the charge based on the polarity signal $V_{A2}$ having a positive polarity is accumulated in the common gate terminal CT, the driving switches Q6 and Q7 are maintained in an ON state. Thus, it maintains an ON state where a potential of the common gate terminal CT of the driving switches Q6 and Q7 has a high level.

Further, when the polarity signal $V_{B1}$ having a negative polarity output from the control circuit 12 is applied through the pulse transformer 15B, the polarity signal $V_{B2}$ having a positive polarity is applied to the terminal B2 of the other end of the secondary inductor L5, and when the PMOS transistor Q10 of the reset drive ON/OFF circuit 25 is turned on and the charge accumulated in the common gate terminal CT is discharged through the PMOS transistor Q10, it maintains an OFF state where a potential of the common gate terminal CT of the driving switches Q6 and Q7 has a low level.

That is, when the polarity signal $V_{B1}$ having a negative polarity is applied through the pulse transformer 15B, the PMOS transistor Q10 forming the reset drive ON/OFF circuit 25 discharges the charge accumulated in the common gate terminal CT of the driving switches Q6 and Q7.

In this manner, the driving switch drive circuit 18 controls ON/OFF of the driving switches Q6 and Q7 based on the polarity signals $V_{A1}$ and $V_{B1}$ output from the control circuit 12.

Further, the drive circuit 10 simultaneously turns on and off the driving switch Q6 and the driving switch Q7 by the driving switch drive circuit 18, and bi-directionally drives the load resistor $R_L$ based on the AC power source $V_{AC}$.

Here, in the reset circuit 8 of the driving switch drive circuit 18, when the polarity signal $V_{A1}$ having a positive polarity is interrupted and when a first predetermined time period has lapsed, for example, when the charge of the capacitor C4 in a fully charged state is discharged through the resistors R41 and R42 and a voltage applied to the gate terminal G of the reset transistor Q3 has a value equal to or lower than a predetermined value, the reset transistor Q3 is turned on to draw out the charge accumulated in the common gate terminal CT of the driving switches Q6 and Q7, regardless of whether the PMOS transistor Q10 of the reset drive ON/OFF circuit 25 is in an ON state. Accordingly, when the driving switches Q6 and Q7 are not controlled by the control circuit 12, since the driving switch drive circuit 18 surely draws out the charge accumulated in the common gate terminal CT of the driving switches Q6 and Q7 to turn them off, the driving switches Q6 and Q7 can be prevented from being turned on by the charge remaining in the common gate terminal CT unintentionally, and in addition, malfunction of the load can be prevented.

Further, in the driving switches Q6 and Q7, the charge accumulated in the common gate terminal CT may be discharged to the outside due to leakage with the lapse of time, leading to a possibility that the driving switches Q6 and Q7 are unintentionally turned off. In this connection, the control circuit 12 may output the polarity signal $V_{A1}$ having a positive polarity at every second predetermined time period shorter than the first predetermined time period when the driving switches Q6 and Q7 are maintained in an ON state. Accordingly, the charge accumulated in the driving switches Q6 and Q7 may be more stably held to let the ON state continue, compared with the case in which the control circuit 12 supplies the polarity signal $V_{A1}$ having a positive polarity to the common gate terminal CT of the driving switches Q6 and Q7 through the pulse transformer 15A once.

Example of Other Operational Waveforms of Drive Circuit

FIGS. 8A to 8E is a view illustrating operational waveforms when the driving switches Q6 and Q7 continuously perform an ON operation in the two-way output power module 2 employing the drive circuit 10 according to the fourth embodiment, wherein FIG. 8A is a waveform of an input control voltage $V_{A1}$ at a terminal A1, FIG. 8B is a waveform of an input control voltage $V_{B1}$ at a terminal B1, FIG. 8C is a waveform of a voltage $V_{A2}$ at a terminal A2, FIG. 8D is a waveform of a voltage $V_{B2}$ at a terminal B2, and FIG. 8E is a waveform of a voltage $V_{CT}$ at a common gate terminal CT.

Further, FIGS. 9A to 9E is a view illustrating operational waveforms when the driving switches Q6 and Q7 continuously perform an OFF operation in the two-way output power module employing the drive circuit according to the fourth embodiment, wherein FIG. 9A is a waveform of an input control voltage $V_{A1}$ at a terminal A1, FIG. 9B is a waveform of an input control voltage $V_{B1}$ at a terminal B1, FIG. 9C is a waveform of a voltage $V_{A2}$ at a terminal A2, FIG. 9D is a waveform of a voltage $V_{B2}$ at a terminal B2, and FIG. 9E is a waveform of a voltage $V_{CT}$ at a common gate terminal CT.

According to the fourth embodiment, it is possible to provide the drive circuit capable of suppressing an increase in power consumption required for turning on or off the driving switch.

According to the fourth embodiment, it is possible to provide the two-way output power module equipped with the drive circuit.

Electronic Devices

The drive circuit equipped with the driving switch drive circuit 18, 18U, or 18D according to the embodiment may be configured as an orthogonal conversion circuit for generating an AC voltage from a DC voltage, such as a bridge type switch circuit or a half-bridge type orthogonal switching circuit, and may be installed in various electronic devices. For example, the drive circuit may be installed in various devices such as a smartphone, a notebook PC, a tablet PC, a monitor or a TV, an external hard disk drive, a set-top box, a vacuum cleaner, a refrigerator, a washing machine, a telephone, a facsimile, a printer, a laser display, a communication device, and a server, as the electronic device.

As described mentioned, according to the present disclosure in some embodiments, it is possible to provide the drive circuit capable of suppressing an increase in power consumption required for turning on or off the driving switch, and the module equipped with the drive circuit.

Other Embodiments

As described above, although the present disclosure has been described with reference to the embodiments, the description and drawings forming part of the disclosure are exemplary and should not be understood as limiting the present disclosure. Various alternative embodiments, examples, and operational techniques will be apparent to those skilled in the art from the disclosure.

In this manner, the present disclosure includes various embodiments, and the like that are not described herein.

The drive circuit according to the embodiment may be installed in various fields such as an orthogonal conversion circuit for generating an AC voltage from a DC voltage, such as a bridge type switch circuit or a half-bridge type orthogonal switching circuit, an AC/DC converter, a DC/DC converter, an LED lighting device, a power factor correction circuit for LED lighting, a home appliance, and a mobile device.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A drive circuit for generating an output voltage for driving a load from a voltage supplied from a power source through switching operations of a driving switch, comprising:
   a control circuit configured to output a polarity signal for controlling ON/OFF of the driving switch;
   a pulse transformer, electrically connected to the control circuit, configured to transmit the polarity signal output from the control circuit;
   a discharge circuit, electrically connected to the pulse transformer and a gate terminal of the driving switch, configured to discharge an electric charge accumulated in the gate terminal of the driving switch based on the polarity signal; and
   a reset circuit, electrically connected to the gate terminal of the driving switch, configured to discharge the electric charge from the gate terminal of the driving switch, regardless of a state of the discharge circuit when the polarity signal having a first polarity is interrupted and a predetermined time period has lapsed,
   wherein, when the polarity signal having the first polarity is applied to the gate terminal through the pulse transformer, the driving switch is switched to an ON state, and is maintained in the ON state by accumulating the electric charge associated with the polarity signal in the gate terminal, and
   wherein, when the polarity signal having a second polarity different from the first polarity is applied to the discharge circuit through the pulse transformer, the driving switch is switched to an OFF state by discharging the electric charge accumulated in the gate terminal by the discharge circuit.

2. The drive circuit of claim 1, wherein the discharge circuit includes:
   a diode having an anode terminal connected to the gate terminal of the driving switch; and
   a discharge transistor having a drain terminal connected to a cathode terminal of the diode and a gate terminal electrically connected to the pulse transformer.

3. The drive circuit of claim 1, wherein the reset circuit includes:
   a capacitor having an end electrically connected to the pulse transformer;
   a resistor having a first end connected to the end of the capacitor and a second end connected to the pulse transformer; and
   a reset transistor having a gate terminal connected to the end of the capacitor and the first end of the resistor and a source terminal electrically connected to the gate terminal of the driving switch.

4. The drive circuit of claim 1, wherein, when the driving switch is maintained in the ON state, the control circuit is configured to output the polarity signal having the first polarity at an interval of a predetermined time period.

5. A motor module including the drive circuit of claim 1.

6. A power module including the drive circuit of claim 1.

7. A drive circuit for driving a load through switching operations of a driving switch, comprising:
   a control circuit configured to output a polarity signal for controlling ON/OFF of the driving switch;
   a pulse transformer, electrically connected to the control circuit, configured to transmit the polarity signal output from the control circuit; and
   a discharge circuit, electrically connected to the pulse transformer and a gate terminal of the driving switch, configured to discharge an electric charge accumulated in the gate terminal of the driving switch based on the polarity signal, wherein, when the polarity signal having a first polarity is applied to the gate terminal through the pulse transformer, the driving switch switched to an ON state, and is maintained in the ON state by accumulating the electric charge associated with the polarity signal in the gate terminal, wherein when the polarity signal having a second polarity different from the first polarity is applied to the discharge circuit through the pulse transformer, the driving switch is switched to an OFF state by discharging the electric charge accumulated in the gate terminal by the discharge circuit, and wherein the discharge circuit includes a discharge transistor having a drain terminal connected to the gate terminal of the driving switch, a source terminal connected to ground, and a gate terminal electrically connected to the pulse transformer.

8. The drive circuit of claim 7, further comprising a reset circuit, electrically connected to the gate terminal of the driving switch, configured to discharge the electric charge from the gate terminal of the driving switch, regardless of a state of the discharge circuit when the polarity signal having the first polarity is interrupted and a predetermined time period has lapsed.

9. The drive circuit of claim 8, wherein the reset circuit comprises:
 a capacitor having an end electrically connected to the pulse transformer;
 a resistor having a first end connected to the end of the capacitor and a second end connected to the pulse transformer; and
 a reset transistor having a gate terminal connected to the end of the capacitor and the first end of the resistor and a source terminal electrically connected to the gate terminal of the driving switch.

10. The drive circuit of claim 7, wherein, when the driving switch is maintained in the ON state, the control circuit is configured to output the polarity signal having the first polarity at an interval of a predetermined time period.

11. A two-way output power module including the drive circuit of claim 7.

12. A drive circuit for driving a load through switching operations of a driving switch, comprising:

a control circuit configured to output a polarity signal for controlling ON/OFF of the driving switch;

a pulse transformer, electrically connected to the control circuit, configured to transmit the polarity signal output from the control circuit;

a discharge circuit, electrically connected to the pulse transformer and a gate terminal of the driving switch, configured to discharge an electric charge accumulated in the gate terminal of the driving switch based on the polarity signal; and a reset circuit, electrically connected to the gate terminal of the driving switch, configured to discharge the electric charge from the gate terminal of the driving switch, regardless of a state of the discharge circuit when the polarity signal having a first polarity is interrupted and a predetermined time period has lapsed, wherein, when the polarity signal having the first polarity is applied to the gate terminal through the pulse transformer, the driving switch switched to an ON state, and is maintained in the ON state by accumulating the electric charge associated with the polarity signal in the gate terminal, and wherein, when the polarity signal having a second polarity different from the first polarity is applied to the discharge circuit through the pulse transformer, the driving switch is switched to an OFF state by discharging the electric charge accumulated in the gate terminal by the discharge circuit.

13. The drive circuit of claim 12, wherein the reset circuit comprises:
 a capacitor having an end electrically connected to the pulse transformer;
 a resistor having a first end connected to the end of the capacitor and a second end connected to the pulse transformer; and
 a reset transistor having a gate terminal connected to the end of the capacitor and the first end of the resistor and a source terminal electrically connected to the gate terminal of the driving switch.

14. The drive circuit of claim 12, wherein, when the driving switch is maintained in the ON state, the control circuit is configured to output the polarity signal having the first polarity at an interval of a predetermined time period.

15. A two-way output power module including the drive circuit of claim 12.

* * * * *